（12）United States Patent
Wang et al.

(10) Patent No.: US 12,387,806 B1
(45) Date of Patent: Aug. 12, 2025

(54) SHIFT REGISTER, DISPLAY PANEL AND DISPLAY DEVICE

(71) Applicant: Xiamen Tianma Optoelectronics Co., Ltd., Xiamen (CN)

(72) Inventors: Yu Wang, Xiamen (CN); Xiaolin Wang, Xiamen (CN); Wei Huang, Xiamen (CN); Hongyuan Huang, Xiamen (CN); Na Zeng, Xiamen (CN); Youqin Yuan, Xiamen (CN)

(73) Assignee: XIAMEN TIANMA OPTOELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 18/780,447

(22) Filed: Jul. 22, 2024

(30) Foreign Application Priority Data

Apr. 28, 2024 (CN) .......................... 202410523817.0

(51) Int. Cl.
*G11C 19/28* (2006.01)
*G09G 3/20* (2006.01)

(52) U.S. Cl.
CPC ............. *G11C 19/287* (2013.01); *G09G 3/20* (2013.01); *G09G 2300/0426* (2013.01); *G09G 2310/0286* (2013.01); *G09G 2320/043* (2013.01); *G09G 2330/021* (2013.01)

(58) Field of Classification Search
CPC .................. G11C 19/287; G09G 3/20; G09G 2300/0426; G09G 2310/0286; G09G 2320/043; G09G 2330/021
See application file for complete search history.

(56) References Cited

U.S. PATENT DOCUMENTS

| 2012/0139883 | A1* | 6/2012 | Lee | G09G 3/3677 327/108 |
|---|---|---|---|---|
| 2018/0082652 | A1* | 3/2018 | Lv | G09G 3/3677 |
| 2018/0188578 | A1* | 7/2018 | Wang | G02F 1/1343 |
| 2020/0035315 | A1* | 1/2020 | Yuan | G11C 19/28 |

FOREIGN PATENT DOCUMENTS

| CN | 108 8066 30 A | 11/2018 |
|---|---|---|
| CN | 1150503 05 A | 9/2022 |

\* cited by examiner

*Primary Examiner* — Pegeman Karimi
(74) *Attorney, Agent, or Firm* — East IP P.C.

(57) ABSTRACT

The present application discloses a shift register, a display panel and a display device, where the shift register includes N cascaded shift register units, each of which includes an input module, a noise reduction module, a pull-down control module, a pull-down module and an output module; where in the same shift register unit, the input module is configured to receive an input signal and control a signal of a first node; the noise reduction module is configured to receive the input signal and a first level signal, and control a transmission path of the first level signal to a second node; the pull-down control module is configured to receive a first clock signal and control a signal of the second node; the output module is configured to receive a second clock signal and a signal of the first node and control a gate drive signal.

18 Claims, 18 Drawing Sheets

SHIFT REGISTER, DISPLAY PANEL AND DISPLAY DEVICE

CROSS-REFERENCE TO RELATED APPLICATIONS

This application claims priority to Chinese Patent Application No. 202410523817.0, titled "SHIFT REGISTER, DISPLAY PANEL AND DISPLAY DEVICE" and filed on Apr. 28, 2024, which is hereby incorporated by reference in its entirety.

TECHNICAL FIELD

The present application relates to the field of display technology, and in particular to a shift register, a display panel and a display device.

BACKGROUND

Display panels are widely used in electronic devices such as smart phones, tablet personal computers, and car navigators, and have become indispensable equipment for people's lives and work. With the development of display technology, people have higher and higher requirements for the display quality of display panels.

At present, a driving circuit is provided in the non-display area of the display panel, which can provide a gate control signal for the pixel units in the display area. However, when the driving circuit works for a long time, the threshold voltage of transistors in the driving circuit may shift. In particular, when the driving circuit is working, the threshold voltage shift of the transistor that is always turned on is more significant, which is likely to cause signal fluctuations at the node and reduce reliability.

SUMMARY

The present application provides a shift register, a display panel and a display device to solve the defects in the prior art, improve the output accuracy of the gate drive signal and improve the display quality.

According to one aspect of the present application, there is provided a shift register, which includes N cascaded shift register units, each of shift register units includes an input module, a noise reduction module, a pull-down control module, a pull-down module, and an output module, where in the same shift register unit, the input module is configured to receive at least an input signal and control a signal of a first node;

the noise reduction module is configured to receive at least the input signal and a first level signal, and, and control a transmission path of the first level signal to a second node according to the input signal;

the pull-down control module is configured to receive at least a first clock signal and control a signal of the second node;

the output module is configured to receive at least a second clock signal and a signal of the first node and control a gate drive signal;

the pull-down module is configured to receive at least the signal of the second node and the first level signal and control the signal of the first node and the gate drive signal, and where a gate drive signal of the shift register unit at an i-th stage is an input signal of the shift register unit at a j-th stage, in which i, j and N each are positive integers, i≠j and i and j are both less than or equal to N.

According to another aspect of the present application, there is provided a display panel, which includes: the above-mentioned shift register.

According to another aspect of the present application, there is provided a display device, which includes: the above-mentioned display panel.

The technical solution of the present application, a noise reduction module is arranged, when the input signal is at an active level, the second node can be controlled to be at an inactive level, that is, the pull-down module is controlled to stop working, so that the signal of the first node is not prone to be affected by the signal of the second node, thereby improving the competitiveness of the first node; at the same time, the pull-down control module receives a first clock signal with an unfixed potential, so that the pull-down control module can control the signal of the second node under the control of the first clock signal, thereby preventing the devices in the pull-down control module from occurring a hysteresis phenomenon due to the pull-down control module receiving a fixed signal for a long time, which would otherwise cause the characteristic curve to change, and affect the accuracy of the signal of the second node; in addition, the hysteresis phenomenon of the devices is improved by arranging the pull-down control module to receive the first clock signal with an unfixed potential, the stability of the characteristic curve can be improved, thereby improving the load capacity, and on the premise of ensuring that the shift register units of the shift registers at respective stages can output the active level of the gate drive signal in sequence, the absolute value of the critical value of the active level can also be reduced, thereby reducing the absolute value of the signal received by the shift register unit, which is conducive to reducing power consumption.

It should be understood that the contents described in this section are not intended to identify the key or important features of the embodiments of the present application, and are not intended to limit the scope of the present application. Other features of the present application may be readily understood through the following description.

BRIEF DESCRIPTION OF THE DRAWINGS

In order to more clearly illustrate the technical solutions in the embodiments of the present application, the drawings required for use in the description of the embodiments are briefly introduced below. Apparently, the drawings described below are only some embodiments of the present application. For those skilled in the art, other drawings can be obtained based on these drawings without creative work.

DETAILED DESCRIPTION

In order to enable those skilled in the art to better understand the scheme of the present application, the technical scheme in the embodiments of the present application will be described in conjunction with the drawings in the embodiments of the present application. Apparently, the described embodiments are only some embodiments of the present application, not all embodiments. Based on the embodiments in the present application, all other embodiments obtained by those skilled in the art without creative work should fall within the scope of protection of the present application.

It should be noted that the terms "first", "second", etc. in the specification and claims of the present application and the above-mentioned drawings are used to distinguish similar objects, and are not necessarily used to describe a specific order or sequence. It should be understood that the numbers used in this way are interchangeable where appropriate, so that the embodiments of the present application described here can be implemented in an order other than those illustrated or described here. In addition, the terms "including" and "having" and any variations thereof are intended to cover non-exclusive inclusions. Exemplarily, a process, method, system, product or device that includes a series of steps or units is not necessarily limited to those steps or units explicitly listed, but may include other steps or units that are not explicitly listed or inherent to these processes, methods, products or devices.

Figure 1:
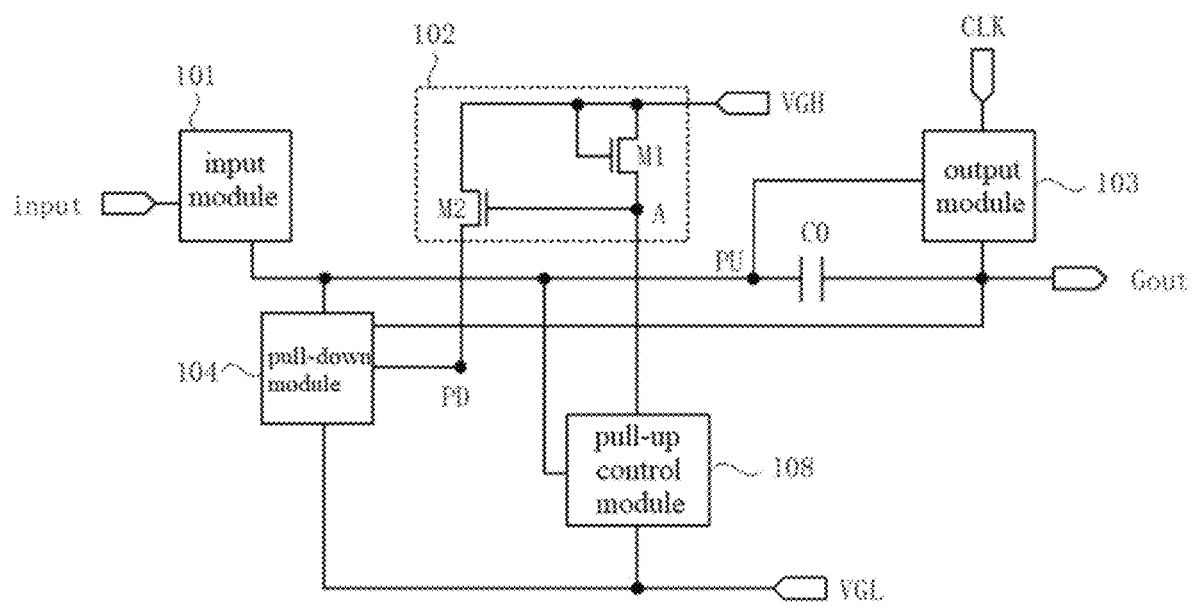
FIG. 1 is a schematic structural diagram of a shift register unit in the related art.

As described in the background, a driving circuit is provided in a non-display area of a display panel, and the driving circuit includes a shift register that includes a plurality of cascaded shift register units. Exemplarily, FIG. 1 is a schematic structural diagram of a shift register unit in the related art. As shown in FIG. 1, in the related art, the shift register unit ASG' includes an input module 101, a pull-down control module 102, a pull-down module 104, and a pull-up control module 108, and the pull-down control module 102 includes a first transistor M1 and a second transistor M2. A gate of the first transistor M1 receives a second level signal VGH, and the first transistor M1 is always turned on. When the driving circuit works for a long time, the gate of the first transistor M1 always receives the second level signal VGH of a fixed potential, and the first transistor M1 is turned on for a long time, which, on the one hand, affects a service life of the first transistor M1, and on the other hand, causes a threshold voltage drift, resulting in reliability problems. The unstable threshold voltage of the first transistor M1 may make the signal of the third node A unstable, causing the second node PD and the pull-down module 104 to be unstable, thereby causing the fluctuation of the first node PU, which is likely to cause the gate drive signal Gout output by the shift register unit ASG' to be distorted, affecting the display quality of the display panel.

To solve the above-mentioned technical problems, an embodiment of the present application provides a shift register, which includes: N cascaded shift register units; the shift register unit includes an input module, a noise reduction module, a pull-down control module, a pull-down module and an output module; in the same shift register unit, the input module is configured to receive at least an input signal and control a signal of a first node; the noise reduction module is configured to receive at least the input signal and the first level signal, and control a transmission path of the first level signal to the second node according to the input signal; the pull-down control module is configured to receive at least a first clock signal and control a signal of the second node; the output module is configured to receive at least the second clock signal and the signal of the first node and control the gate drive signal; the pull-down module is configured to receive at least the signal of the second node and the first level signal and control the signal of the first node and the gate drive signal, where the gate drive signal of the shift register unit at an i-th stage is an input signal of the shift register unit at a j-th stage; i, j and N each are positive integers, i≠j and i and j are both less than or equal to N.

The above-mentioned technical solution is adopted, a noise reduction module is arranged, when the input signal is at an active level, the second node can be controlled to be at an inactive level, that is, the pull-down module is controlled to stop working, so that the signal of the first node is not prone to be affected by the signal of the second node, thereby improving the competitiveness of the first node; at the same time, the pull-down control module receives a first clock signal with an unfixed potential, so that the pull-down control module can control the signal of the second node under the control of the first clock signal, thereby preventing the devices in the pull-down control module from occurring a hysteresis phenomenon due to the pull-down control module receiving a fixed signal for a long time, which would otherwise cause the characteristic curve to change, and affect the accuracy of the signal of the second node; in addition, the hysteresis phenomenon of the devices is improved by arranging the pull-down control module to receive the first clock signal with an unfixed potential, the stability of the characteristic curve can be improved, thereby improving the load capacity, and on the premise of ensuring that the shift register units of the shift registers at respective stages can output the active level of the gate drive signal in sequence, the absolute value of the critical value of the active level can also be reduced, thereby reducing the absolute value of the signal received by the shift register unit, which is conducive to reducing power consumption.

The above is the core idea of the present application. Based on the embodiments in the present application, all other embodiments obtained by those skilled in the art without creative work are within the scope of protection in the present application. The technical scheme in the embodiments of the present application will be clearly and completely described in combination with the drawings in the embodiments of the present application.

Figure 2:
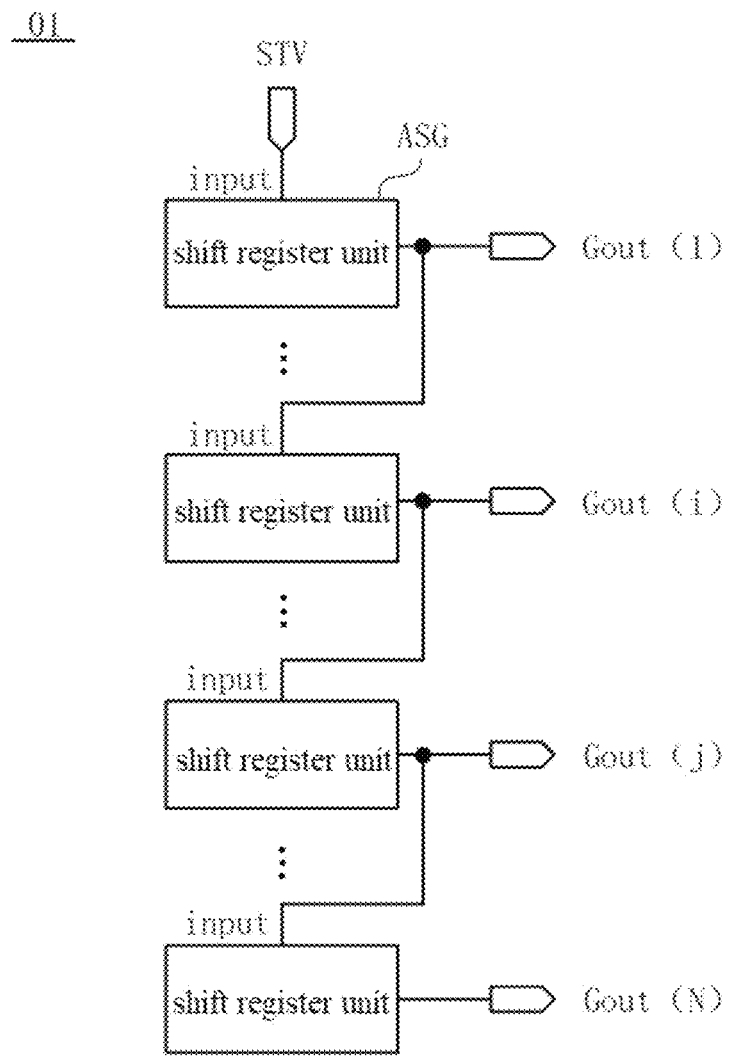
FIG. 2 is a schematic structural diagram of a shift register provided by an embodiment of the present application.
Figure 3:
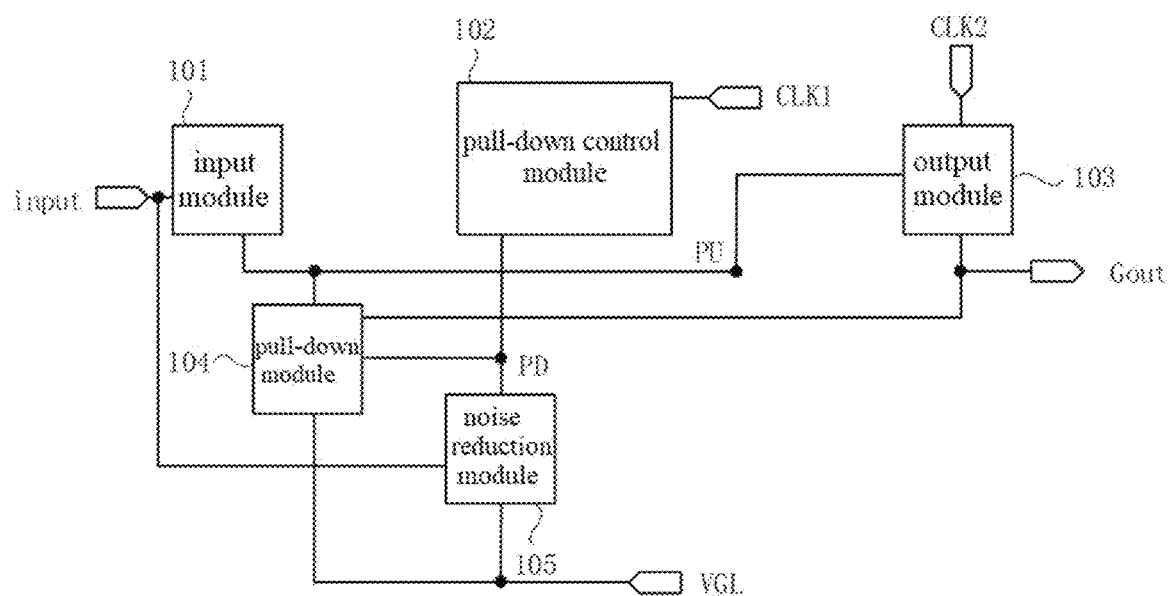
FIG. 3 is a schematic structural diagram of a shift register unit provided by an embodiment of the present application.

FIG. 2 is a schematic structural diagram of a shift register provided in an embodiment of the present application, and FIG. 3 is a schematic structural diagram of a shift register unit provided in an embodiment of the present application. Referring to FIG. 2 and FIG. 3, the shift register 01 includes N cascaded shift register units ASGs, and the N cascaded shift register units ASGs can output the active level of the gate drive signal Gout in sequence, where N is a positive integer.

Each shift register unit ASG includes an input module 101, a pull-down control module 102, an output module 103, a pull-down module 104 and a noise reduction module 105. In the same shift register unit ASG, the input module 101 is configured to receive at least the input signal input and control the signal of the first node PU; the noise reduction module 105 is configured to receive at least the input signal input and the first level signal VGL, and control a transmission path of the first level signal VGL to the second node PD according to the input signal input; the pull-down control module 102 is configured to receive at least the first clock signal CLK1 and control the signal of the second node PD; the output module 103 is configured to receive at least the second clock signal CLK2 and the signal of the first node PU and control the gate drive signal Gout; the pull-down module 104 is configured to receive at least the signal of the second node PD and the first level signal VGL and control the signal of the first node PU and the gate drive signal Gout.

Exemplarily, a control end of the input module 101 receives the input signal input, the output end of the input module 101 and the control end of the output module 103 are electrically connected to the first node PU, the input end of the output module 103 receives the second clock signal CLK2, and the output end of the output module 103 outputs the gate drive signal Gout. The control end of the pull-down control module 102 receives the first clock signal CLK1, the output end of the pull-down control module 102 and the control end of the pull-down module 104 are electrically connected to the second node PD, the input end of the pull-down module 104 receives the first level signal VGL, and the output end of the pull-down module 104 is electrically connected to the first node PU and the output end of the output module 103 respectively. The control end of the noise reduction module 105 receives the input signal input, the input end of the noise reduction module 105 receives the first level signal VGL, and the output end of the noise reduction module 105 is electrically connected to the second node PD.

Figure 4:
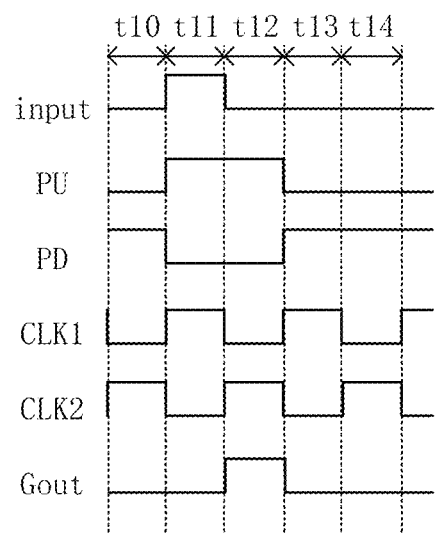
FIG. 4 is a time sequence diagram of a shift register unit provided by an embodiment of the present application.

In an optional embodiment, taking the case where the active level is a high level, the inactive level is a low level, and the first level signal VGL is at a low level as an example, FIG. 4 is a time sequence diagram of a shift register unit provided by an embodiment of the present application. Referring to FIG. 3 and FIG. 4, during stage t10, the input signal input is at an inactive level; the input module 101 and the noise reduction module 105 are turned off; the signal of the first node PU is at an inactive level; the signal of the second node PD is at an active level; the pull-down module 104 is turned on; the signal of the first node PU and the gate drive signal Gout are the first level signal VGL, that is, the signal of the first node PU and the gate drive signal Gout are both at an inactive level; the gate drive signal Gout output by the shift register unit ASG is at an inactive level.

During stage t11, the input signal input is at an active level, the input module 101 and the noise reduction module 105 are turned on, and the input module 101 can cause the signal of the first node PU to be at an active level under the control of the active level of the input signal input. At this time, the signal of the first node PU can control the output module 103 to be turned on, so that the second clock signal CLK2 can be output through the output module 103, and the gate drive signal Gout is consistent with the second clock signal CLK2, that is, the gate drive signal Gout output by the shift register unit ASG is at an inactive level; at the same time, the noise reduction module 105 can transmit the first level signal VGL to the second node PD, so that the signal of the second node PD is at an inactive level, thereby ensuring that the signal of the second node PD may not control the pull-down module 104 to be turned on, so that the pull-down module 104 can be prevented from pulling down the signal of the first node PU and the gate drive signal Gout to be at an inactive level during this stage so as not to affect the accuracy of the gate drive signal Gout output by the shift register unit ASG; in addition, during this stage, although the pull-down control module 102 receives the first clock signal CLK1 at an active level and some devices in the pull-down control module 102 may be in an on state, however under the coordinated control of the input module 101, the noise reduction module 105 and the pull-down control module 102, etc., the signal of the first node PU can be maintained at an active level, and the signal of the second node PD can be maintained at an inactive level.

During stage t12, the input signal input is at an inactive level, the input module 101 and the noise reduction module 105 are both turned off, and under the premise that no new signal is written, the signal of the second node PD can be maintained at an inactive level, and the signal of the first node PU can also be maintained at an active level, and the output module 103 continues to be turned on, and the active level of the second clock signal CLK2 can be output through the output module 103, so that the gate drive signal GOUT continues to be consistent with the second clock signal CLK2, that is, the gate drive signal Gout that the shift register unit ASG can output is at an active level. At the same time, during this stage, the first clock signal CLK1 changes to an inactive level, so that the devices in the pull-down control module 102 are in a turned-off state, thereby ensuring that the devices in the pull-down control module 102 may not be in an on state for a long time, preventing the devices in the pull-down control module 102 from being turned on for a long time, which would otherwise cause threshold voltage thereof to drift and affect the normal operation of the shift register unit ASG.

During stage t13, the input signal input continues to be maintained at an inactive level, the input module 101 and the noise reduction module 105 are both in the off state, the signal of the first node PU is no longer controlled by the input module 101, and the signal of the second node PD is no longer controlled by the noise reduction module 105; at the same time, the first clock signal CLK1 is at an active level, and the pull-down control module 102 can cause the signal of the second node PD to be at an active level under the control of the active level of the first clock signal CLK1, and the signal of the second node PD can control the pull-down module 104 to be turned on, so that the signal of the first node PU and the gate drive signal Gout are the first level signal VGL, that is, the signal of the first node PU and the gate drive signal Gout are both at an inactive level, and at this time, the gate drive signal Gout output by the shift register unit ASG is at an inactive level.

During stage t14, the input signal input continues to be maintained at an inactive level, the input module 101 and the noise reduction module 105 are both turned off, and at the same time, the first clock signal CLK1 also changes to an inactive level, and the devices in the pull-down control module 102 are in the off state. Under the premise that no new signal is written to the first node PU and the second node PD, the signal of the first node PU is maintained at an inactive level, the signal of the second node PD is maintained at an active level, the pull-down module 104 remains in an on state, and the signal of the first node PU and the gate drive signal Gout are the first level signal VGL, that is, the signal of the first node PU and the gate drive signal Gout are both at an inactive level, and the gate drive signal Gout output by the shift register unit ASG continues to remain at an inactive level.

After t14 stage, the input signal input may remain at an inactive level, and the first clock signal CLK1 may alternately jump between the active level and the inactive level, so that the signal of the first node PU can remain at an inactive level, the signal of the second node PD can remain at an active level, and the gate drive signal GOUT output by the shift register unit ASG may remain at an inactive level until the input signal input jumps to an active level again.

Referring to FIG. 2, the gate drive signal Gout (i) of the shift register unit ASG at an i-th stage is the input signal input of the shift register unit ASG at a j-th stage, where i and j are both positive integers, i≠j and i and j are both less than or equal to N.

Specifically, before the shift register unit ASG at the j-th stage outputs the active level of the gate drive signal Gout(j), the shift register unit ASG at the j-th stage receives the active level of the input signal input, that is, the effective time of the gate drive signal Gout(i) of the shift register unit ASG at the i-th stage is before the effective time of the gate drive signal Gout(j) of the shift register unit ASG at the j-th stage.

Figure 5:
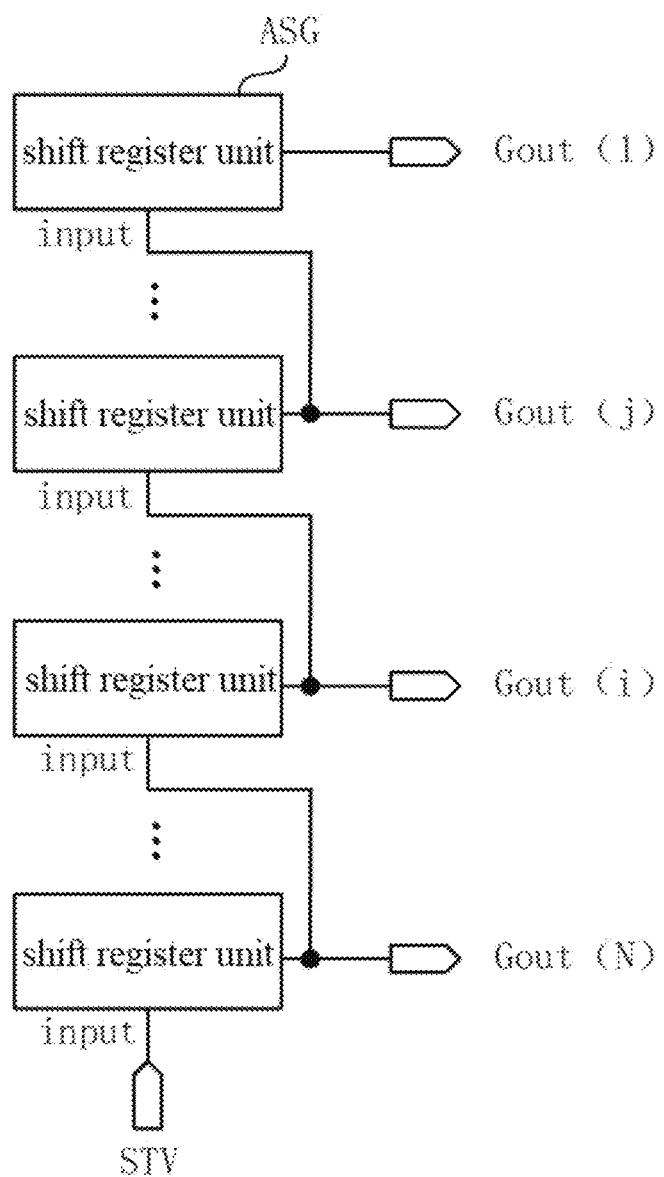
FIG. 5 is a schematic structural diagram of another shift register provided by an embodiment of the present application.

Here i may be less than j, in which case the effective time of the gate drive signal Gout of the shift register unit ASG at a front stage is before the effective time of the gate drive signal Gout of the shift register unit ASG at a back stage; in other optional embodiments, as shown in FIG. 5, i may also be greater than j, in which case the effective time of the gate drive signal Gout of the stage shift register unit ASG at a back stage is before the effective time of the gate drive signal Gout of the shift register unit ASG at a front stage.

Figure 6:
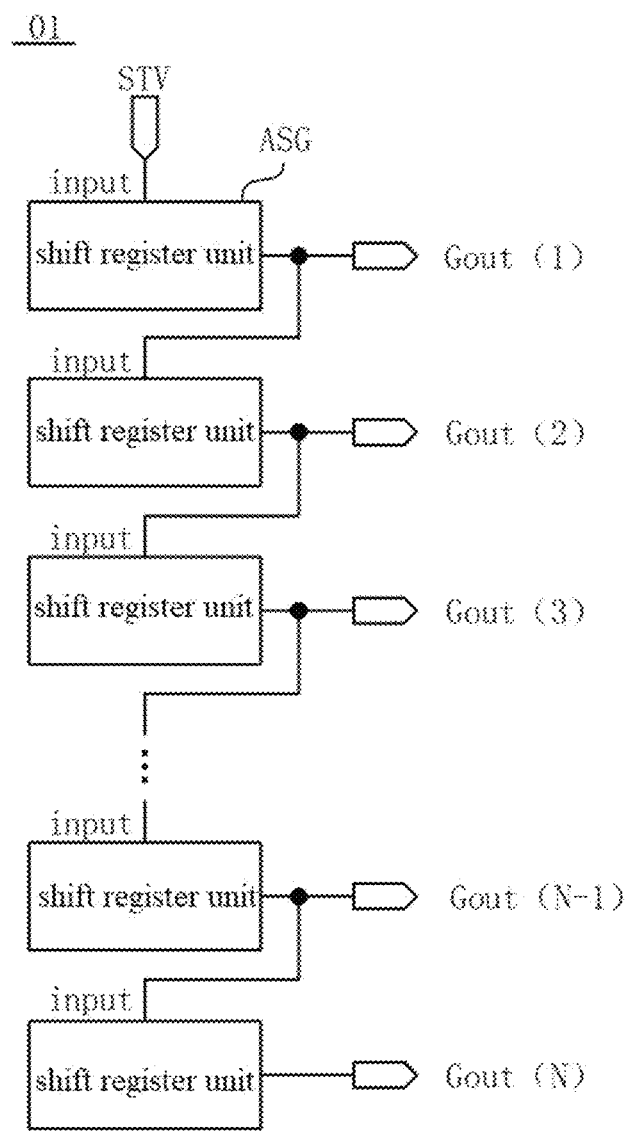
FIG. 6 is a schematic structural diagram of another shift register provided by an embodiment of the present application.
Figure 7:
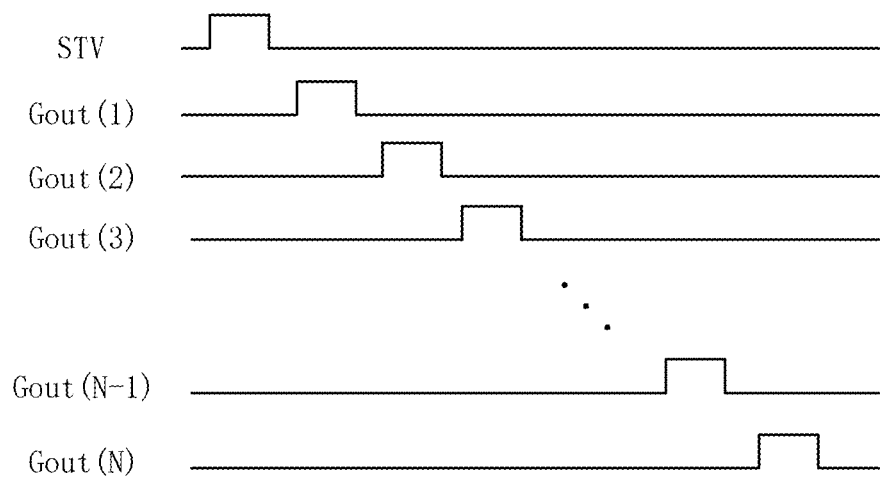
FIG. 7 is a time sequence diagram of a shift register provided by an embodiment of the present application.

Exemplarily, when i=j−1, as shown in FIG. 6 and FIG. 7, the shift register unit ASG at a first stage receives the start signal STV as the input signal input, and the other shift register units ASGs receive the gate drive signal Gout of the shift register unit ASG at one stage in front as the input signal input. When the start signal STV is at an active level, the shift register units ASGs at respective stages can sequentially output the active level of the gate drive signal Gout.

Figure 8:
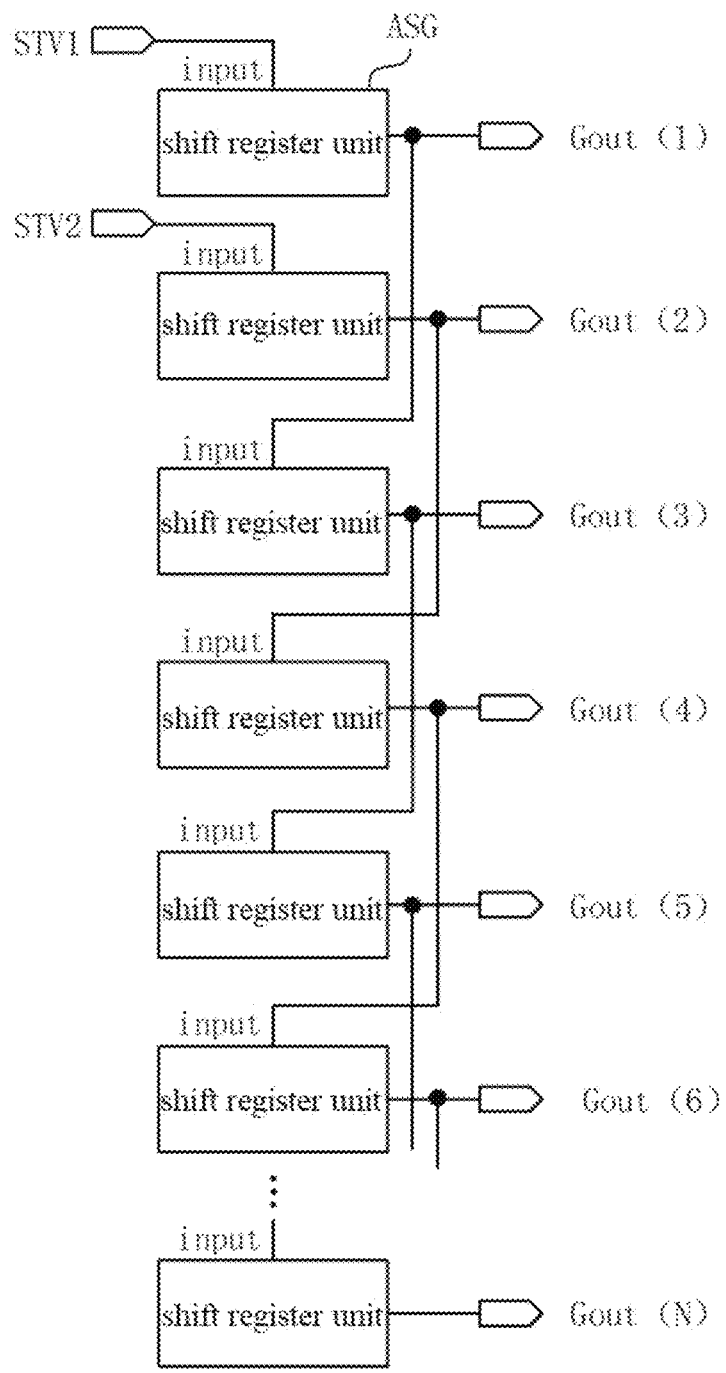
FIG. 8 is a schematic structural diagram of another shift register provided by an embodiment of the present application.

Exemplarily, taking i=j−2 as an example, as shown in FIG. 8, the shift register unit ASG at a first stage receives the first start signal STV1 as an input signal input, the shift register unit ASG at a second stage receives the second start signal STV2 as an input signal input, and the shift register units ASGs at the other stages each receive the gate drive signals Gout of the shift register units ASGs at two stages in front as input signals input. Exemplarily, when j>2, the shift register unit ASG at the j-th stage receives the gate drive signal Gout(j−2) of the shift register unit ASG at the (j−2)-th stage as input signal input. When the first start signal STV1 is at an active level, the shift register units ASGs at odd-numbered stages can sequentially output the active level of the gate drive signal Gout; when the second start signal STV2 is at an active level, the shift register units ASGs at even-numbered stages can sequentially output the active level of the gate drive signal Gout. In an embodiment, the effective time of the second start signal STV2 is after the effective time of the first start signal STV1 and before the effective time of the gate drive signal Gout output by the shift register unit ASG at a first stage. In this way, the shift register units ASGs at respective stages can output the active level of the gate drive signal Gout in sequence.

It can be understood that, under the premise that the gate drive signal Gout(i) of the shift register unit ASG at the i-th stage can be used as the input signal input of the shift register unit ASG at the j-th stage, in the embodiment of the present application, the relationship between i and j may also be i=j−3, i=j−4, i=j+1, i=j+2, i=j+3, i=j+4, etc., and the embodiments of the present application are not listed one by one.

In the embodiment of the present application, by arranging a noise reduction module, when the input signal is at an active level, the second node can be controlled to be at an inactive level, that is, the pull-down module can be controlled to stop working, so that the signal of the first node is not prone to be affected by the signal of the second node, thereby improving the competitiveness of the first node; at the same time, the pull-down control module receives a first clock signal with an unfixed potential, so that the pull-down control module can control the signal of the second node under the control of the first clock signal, thereby preventing the devices in the pull-down control module from occurring a hysteresis phenomenon due to the pull-down control module receiving a fixed signal for a long time, which would otherwise cause the characteristic curve to change and affect the accuracy of the signal of the second node; in addition, by arranging the pull-down control module to receive the first clock signal with an unfixed potential, the hysteresis phenomenon of the devices can be improved, and the stability of the characteristic curve can be improved, thereby improving the load capacity. On the premise of ensuring that the shift register units of the shift registers at respective stages can output the active level of the gate drive signal in sequence, the absolute value of the critical value of the active level can also be reduced, thereby reducing the absolute value of the signal received by the shift register unit, which is conducive to reducing power consumption.

Figure 9:
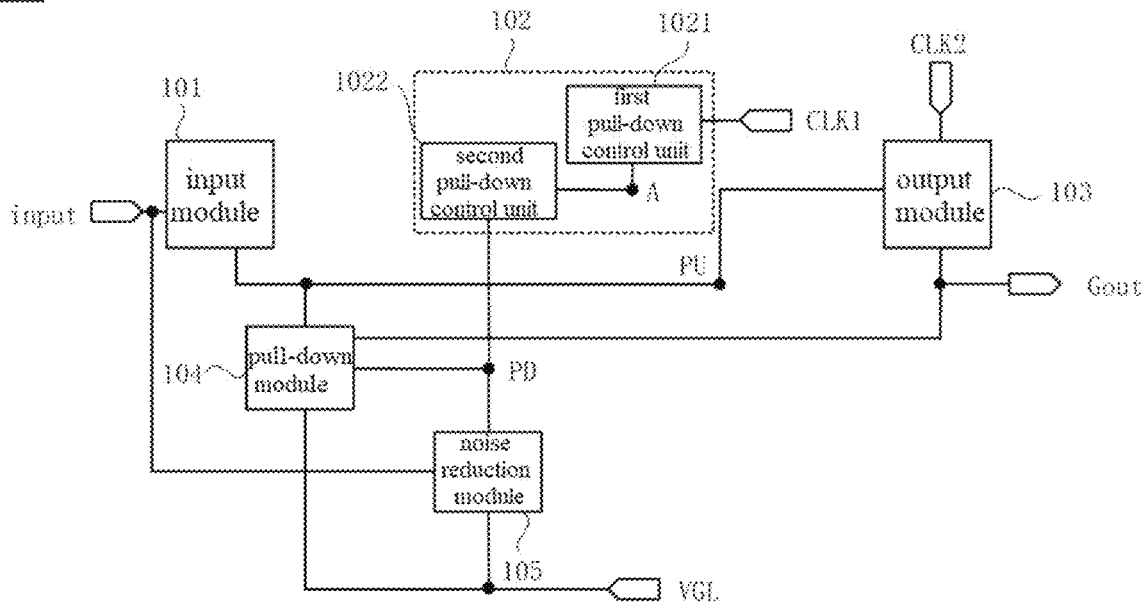
FIG. 9 is a schematic structural diagram of another shift register unit provided by an embodiment of the present application.

Optionally, FIG. 9 is a schematic structural diagram of another shift register unit provided by an embodiment of the present application. Referring to FIG. 9, the pull-down control module 102 includes a first pull-down control unit 1021 and a second pull-down control unit 1022. The first pull-down control unit 1021 is configured to receive at least the first clock signal CLK1 and control the signal of the third node A.

Specifically, the control end of the first pull-down control unit 1021 receives the first clock signal CLK1, the output end of the first pull-down control unit 1021 and the control end of the second pull-down control unit 1022 are electrically connected to the third node A, and the output end of the second pull-down control unit 1022 and the output end of the noise reduction module 105 and the control end of the pull-down module 104 are electrically connected to the second node PD.

Exemplarily, when the signal of the first node PU is at an inactive level and the first clock signal CLK1 is at an active level, the first pull-down control unit 1021 is turned on. The first pull-down control unit 1021 can, under the control of the active level of the first clock signal CLK1, cause the signal at the third node A to be at an active level; the active level of the signal at the third node A can control the second pull-down control unit 1022 to be turned on, so that the signal at the second node PD changes to an active level, thereby controlling the signal at the second node PD. When both the first pull-down control unit 1021 and the second pull-down control unit 1022 of the pull-down control module 102 are turned on, the signal at the second node PD can be turned into an active level, and the pull-down module 104 can be turned on under the control of the active level of the signal at the second node PD, so that the signal at the first node PU and the gate drive signal Gout are the first level signal VGL, thereby achieving pull-down of the signal at the first node PU and the gate drive signal Gout. The first pull-down control unit 1021 and the second pull-down control unit 1022 are arranged in the pull-down control module 102, the first pull-down control unit 1021 is set to be controlled by the first clock signal CLK1, and the second pull-down control unit 1022 is set to be controlled by the third node A, so that the working state of the pull-down control module 102 can be affected by the first clock signal CLK1 and the signal of the third node A at the same time, avoiding that the working state of the pull-down control module 102 is controlled only by the first clock signal CLK1, which would otherwise cause that the pull-down control module 102 is unable to control the signal of the second node PD when the first clock signal CLK1 jumps to an inactive level. That is, this embodiment can accurately control the signal of the second node, thereby improving the reliability of the shift register unit ASG.

It should be noted that the signal of the third node A, the signal of the second node PD, the signal of the first node PU, and the gate drive signal Gout require the coordinated action of the input module 101, the noise reduction module 105, and the pull-down control module 102, etc. The above embodiment only exemplarily describes the situation when the signal of the first node PU is at an inactive level and the first clock signal CLK1 is at an active level, such as stage t13 shown in FIG. 4. To facilitate the description of the working principle of the pull-down control module 102, unless otherwise specified, the description of the working state of the first pull-down control unit 1021 and the second pull-down control unit 1022 in the pull-down control module 102 hereinafter refers to the description at the stage when the signal of the first node PU is at an inactive level.

Figure 10:
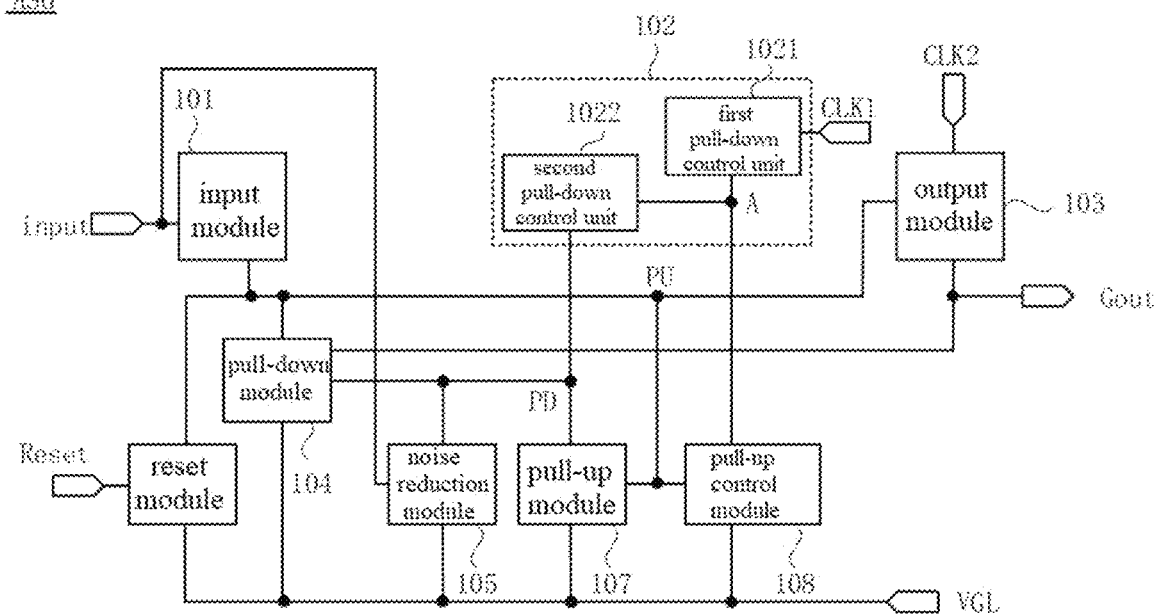
FIG. 10 is a schematic structural diagram of another shift register unit provided by an embodiment of the present application.

Optionally, FIG. 10 is a schematic structural diagram of another shift register unit provided by an embodiment of the present application. Referring to FIG. 10, the shift register unit ASG further includes a pull-up control module 108 and a pull-up module 107. The pull-up control module 108 is configured to receive at least the signal of the first node PU and the first level signal VGL to control the signal of the third node A; the pull-down control module 102 is also configured to control the signal of the second node PD according to the signal of the third node A; the pull-up module 107 is configured to receive at least the signal of the first node PU and the first level signal VGL to control the signal of the second node PD.

Exemplarily, the control end of the pull-up control module 108 is electrically connected to the first node PU, the input end of the pull-up control module 108 receives the first level signal VGL, and the output end of the pull-up control module 108 is electrically connected to the third node A; the control end of the first pull-down control module unit 1021 receives the first clock signal CLK1, the output end of the first pull-down control module unit 1021 and the control end of the second pull-down control module unit 1022 are electrically connected to the third node A, and the output end of the second pull-down control module unit 1022 is electrically connected to the second node PD; the control end of the pull-up module 107 is electrically connected to the first node PU, the input end of the pull-up module 107 receives the first level signal VGL, and the output end of the pull-up module 107 is electrically connected to the second node PD.

When the input signal input jumps to the active level so that the signal of the first node PU changes to the active level, the output module 103, the pull-up control module 108 and the pull-up module 107 are all turned on, the output module 103 can output the second clock signal CLK2 as the gate drive signal Gout, the pull-up control module 108 can make the signal of the third node A consistent with the first level signal VGL, and the pull-up module 107 can make the signal of the second node PD consistent with the first level signal VGL, so that the signal of the third node A and the signal of the second node PD are both at an inactive level. At this time, the second pull-down control unit 1022 is turned off under the control of the signal of the third node A, and the pull-down module 104 is turned off under the control of the signal of the second node PD. During this stage, no matter the first clock signal CLK1 is at an active level or an inactive level, the signal of the third node A can be kept at an inactive level through the pull-up control module 108, and the signal of the second node PD can be kept at an inactive level through the pull-up module 107, so that the second pull-down control unit 1022 and the pull-down module 104 are both turned off to improve the competitiveness of the signal of the first node PU, ensure the accuracy of the gate output signal Gout, and prevent the signal of the first node PU and the gate drive signal Gout from fluctuating due to the influence of the pull-down control module 102.

Still referring to FIG. 10, when the signal at the first node PU is at an inactive level, the output module 103, the pull-up control module 108 and the pull-up module 107 are all turned off, the output module 103 stops outputting the second clock signal CLK2 as the gate drive signal Gout, the signal at the third node A is no longer controlled by the pull-up control module 108, and the signal at the second node PD is no longer controlled by the pull-up module 107; at this time, if the first clock signal CLK1 is at an active level, the first pull-down control unit 1021 can cause the signal at the third node A to be at an active level under the control of the first clock signal CLK1, and the second pull-down control unit 1022 can cause the signal at the second node PD to be at an active level under the control of the signal at the third node A, thereby controlling the pull-down module 104 to be turned on, so that the signal at the first node PU and the gate drive signal Gout are consistent with the first level signal VGL, and the signal at the first node PU and the gate drive signal Gout are both at an inactive level.

In addition, when the signal of the first node PU is at an inactive level, if the first clock signal CLK1 changes from an active level to an inactive level, although the first clock signal CLK1 no longer controls the pull-down control module 102 to be turned on, and the pull-down control module 102 is in an off state, at the inactive level stage of the signal of the first node PU, the pull-up control module 108 and the pull-up module 107 are also in an off state, so that the signal of the third node A and the signal of the second node PD can still be maintained at an active level, and the pull-down module 104 is controlled to be turned on, and the signal of the first node PU and the gate drive signal Gout continue to be maintained at an inactive level, exemplarily, during stage t14 in FIG. 4, until the input signal input jumps to an active level, the signal of the first node PU changes to an active level through the output module 101, the pull-up module 107 and the pull-up control module 108 are turned on, and the signal of the third node A and the signal of the second node PD will jump from an active level to an inactive level.

Figure 11:
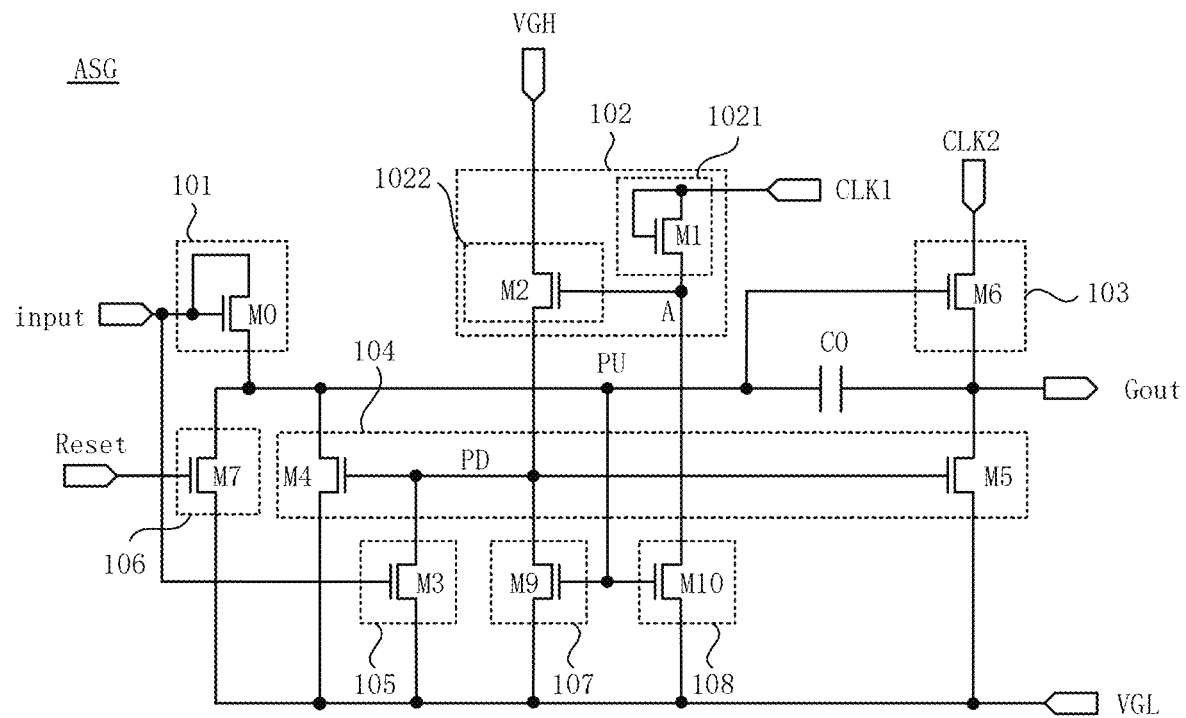
FIG. 11 is a schematic structural diagram of another shift register unit provided by an embodiment of the present application.
Figure 12:
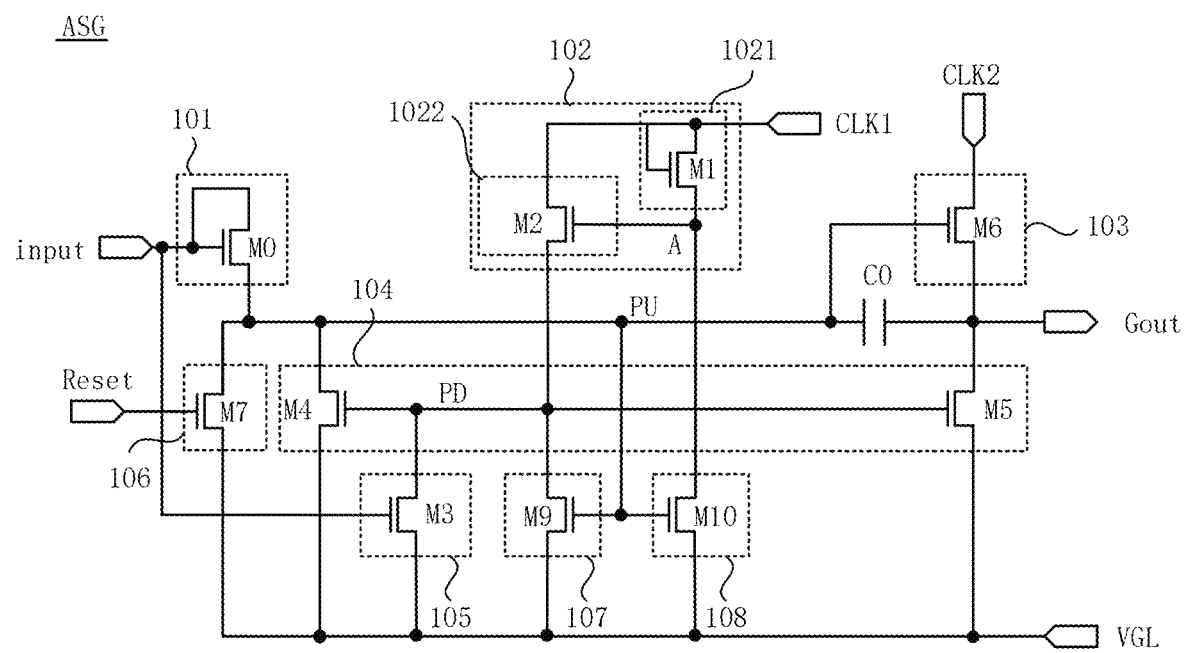
FIG. 12 is a schematic structural diagram of another shift register unit provided by an embodiment of the present application.

In an optional embodiment, FIG. 11 is a schematic structural diagram of another shift register unit provided by an embodiment of the present application, and FIG. 12 is a schematic structural diagram of another shift register unit provided by an embodiment of the present application. Referring to FIG. 11 and FIG. 12, the first pull-down control unit 1021 includes a first transistor M1, a gate and a first electrode of the first transistor M1 both receive the first clock signal CLK1, and a second electrode of the first transistor M1 is electrically connected to the third node A.

Specifically, when the first clock signal CLK1 is at an active level, the first transistor M1 is turned on, and the active level of the first clock signal CLK1 can be transmitted to the third node A; when the first clock signal CLK1 is at an inactive level, the first transistor M1 is turned off, and the first clock signal CLK1 is stopped from being transmitted to the third node A. By setting the gate of the first transistor M1 to receive the first clock signal CLK1 with an unfixed potential, the first transistor M1 can be turned on intermittently when the shift register 01 is working, so that the first transistor M1 can be prevented from receiving a fixed signal for a long time, which would otherwise result in a hysteresis phenomenon, causing the threshold voltage of the first transistor M1 to shift, and affecting the accuracy of the signal of the third node A and the signal of the second node PD.

Exemplarily, taking the case where the active level is a high level, the inactive level is a low level, and the first transistor M1 is an N-type transistor as an example, referring to FIG. 11 and FIG. 12, the second pull-down control unit 1022 includes a second transistor M2, and the channel type of the second transistor M2 is the same as the channel type of the first transistor M1, both of which are N-type transistors. In an embodiment, the gate of the second transistor M2 is electrically connected to the third node A, the first electrode of the second transistor M2 receives the second level signal VGH, the second level signal VGH is at a high level, and the second electrode of the second transistor M2 is electrically connected to the second node PD; in another embodiment, the gate of the second transistor M2 is electrically connected to the third node A, the first electrode of the second transistor M2 receives the first clock signal CLK1, and the second electrode of the second transistor M2 is electrically connected to the second node PD.

When the signal of the first node PU is at a low level and the first clock signal CLK1 is at a high level, the first transistor M1 is turned on, so that the third node A can be written with the first clock signal CLK1, the signal of the third node A is at the high level of the first clock signal CLK1, and the second transistor M2 can be turned on under the control of the high level of the third node A, so that the second node PD can be written with the second level signal VGH or the first clock signal CLK1, and the signal of the second node PD is at the high level of the second level signal VGH or the first clock signal CLK1, thereby controlling the pull-down module 104 to be turned on, and achieving the pull-down of the signal of the first node PU and the gate drive signal Gout.

It should be noted that the active level may be a high level or a low level. When the first transistor M1 is an N-type transistor, the active level is a high level and the inactive level is a low level; when the first transistor M1 is a P-type transistor, the active level is a low level and the inactive level is a high level. For the convenience of description, unless otherwise specified, the embodiment of the present application takes the case where all transistors in the shift register unit ASG are N-type transistors and the active levels are all high levels as an example to exemplify the technical solution of the embodiment of the present application.

Figure 13:
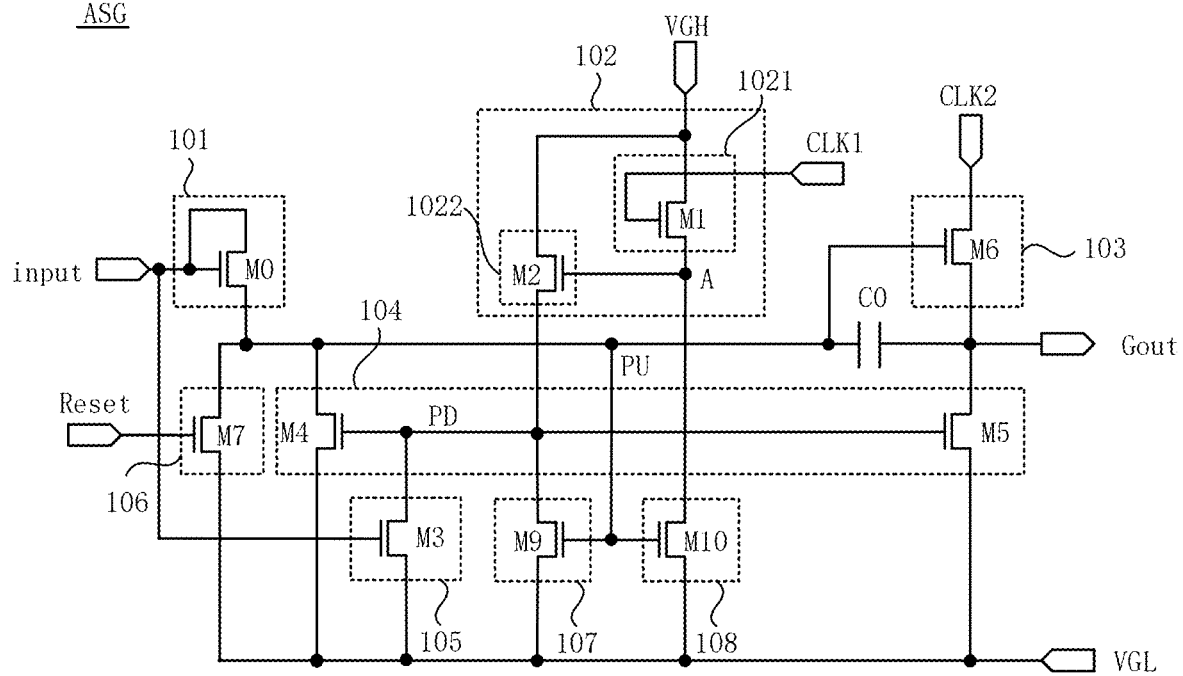
FIG. 13 is a schematic structural diagram of another shift register unit provided by an embodiment of the present application.
Figure 14:
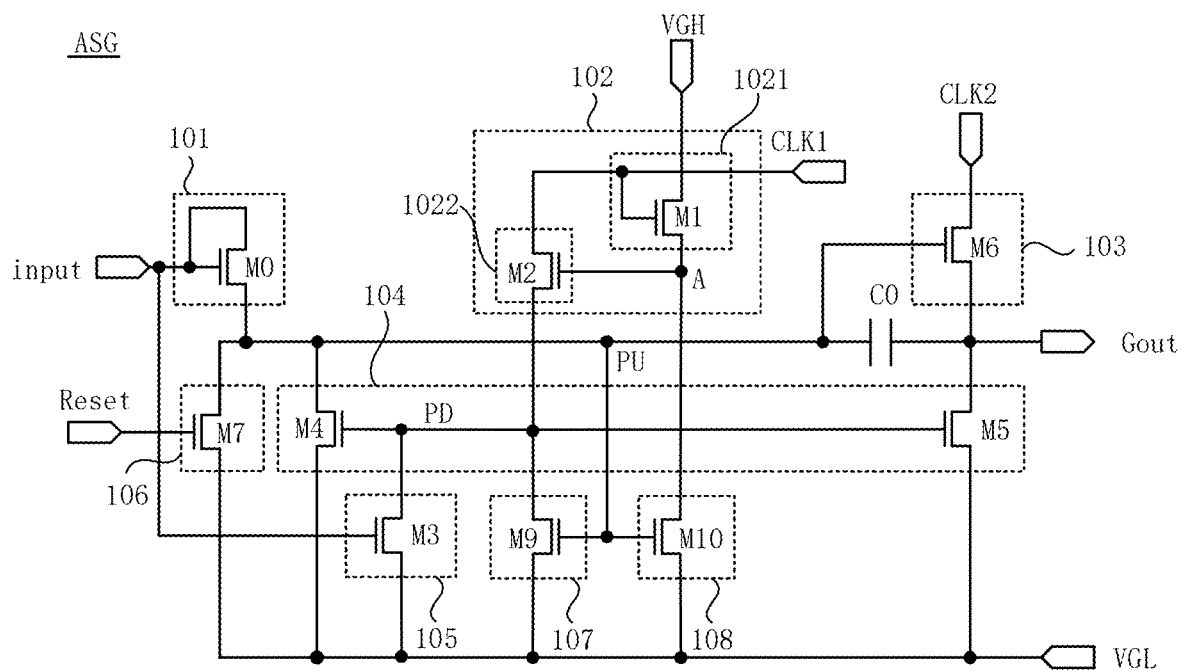
FIG. 14 is a schematic structural diagram of another shift register unit provided by an embodiment of the present application.

In another optional embodiment, FIG. 13 is a schematic structural diagram of another shift register unit provided by the embodiment of the present application, and FIG. 14 is a schematic structural diagram of another shift register unit provided by the embodiment of the present application. Referring to FIG. 13 and FIG. 14, the first pull-down control unit 1021 includes a first transistor M1, the gate of the first transistor M1 receives the first clock signal CLK1, the first electrode of the first transistor M1 receives the second level signal VGH, and the second electrode of the first transistor M1 is electrically connected to the third node A.

Specifically, when the first clock signal CLK1 is at an active level, the first transistor M1 is turned on, and the active level of the second level signal VGH can be transmitted to the third node A; when the first clock signal CLK1 is at an inactive level, the first transistor M1 is turned off, and the second level signal VGH is stopped from being transmitted to the third node A. In this way, the first transistor M1 can also be prevented from receiving a fixed signal for a long time, which would otherwise result in a hysteresis phenomenon, causing the threshold voltage of the first transistor M1 to shift, and affecting the signal of the third node A and the signal of the second node PD.

Exemplarily, taking the case where the active level is a high level, the inactive level is a low level, and the first transistor M1 is an N-type transistor, and the second level signal VGH is at a high level as an example, referring to FIG. 12 and FIG. 13, the second pull-down control unit 1022 includes a second transistor M2, and the channel type of the second transistor M2 is the same as the channel type of the first transistor M1, both of which are N-type transistors. When the signal of the first node PU is at a low level and the first clock signal CLK1 is at a high level, the first transistor M1 is turned on, so that the third node A can be written with the second level signal VGH, and the signal of the third node A is at a high level of the second level signal VGH. The second transistor M2 can be turned on under the control of the high level of the third node A, so that the second node PD can be written with the high level of the second level signal VGH or the first clock signal CLK1, thereby controlling the pull-down module 104 to be turned on, and achieving the pull-down of the signal of the first node PU and the gate drive signal Gout.

In another optional embodiment, referring to FIG. 11 and FIG. 13, the second pull-down control unit 1022 includes a second transistor M2, the gate of the second transistor M2 is electrically connected to the third node A, the first electrode of the second transistor M2 receives the second level signal VGH, and the second electrode of the second transistor M2 is electrically connected to the second node PD.

Specifically, when the signal at the third node A is at an active level, the second transistor M2 is turned on, and the active level of the second level signal VGH can be transmitted to the second node PD; when the signal at the third node A is at an inactive level, the second transistor M2 is turned off, and the second level signal VGH is stopped from being transmitted to the second node PD; when the signal at the first node PU is at an inactive level, the signal at the third node A can be determined by the first clock signal CLK1. In this way, on the one hand, it is possible to avoid the second transistor M2 receiving a fixed signal for a long time, causing a hysteresis phenomenon, resulting in a threshold voltage offset of the second transistor M2, and affecting the accuracy of the signal of the second node PD; on the other hand, the second pull-down control unit 1022 controls the signal of the second node PD through the second transistor M2, and the state of the second transistor M2 is controlled by the signal of the third node A. The signal of the third node A can be controlled under the coordinated action of the input module 101, the noise reduction module 105 and the pull-down control module 102, etc., so that the pull-down control module 102 can be unaffected by the signal jump of the first clock signal CLK1, and continuously control the signal of the second node PD to be a certain potential. The first switch unit 1021 may be a structure as shown in FIG. 11 or FIG. 13, or the first switch unit 1021 can also be other structures, which is not specifically limited in the embodiment of the present application.

In an embodiment, referring to FIG. 11, the first pull-down control unit 1021 includes a first transistor M1, the gate and the first electrode of the first transistor M1 both receive the first clock signal CLK1, the second electrode of the first transistor M1 and the gate of the second transistor M2 of the second pull-down control unit 1022 are electrically connected to the third node A, the first electrode of the second transistor M2 receives the second level signal VGH, and the second electrode of the second transistor M2 is electrically connected to the second node PD. When the first clock signal CLK1 is at an active level, the first transistor M1 is turned on, and the active level of the first clock signal CLK1 is transmitted to the third node A through the first transistor M1; at this time, the signal of the third node A is at an active level, the second transistor M2 is turned on, and the active level of the second level signal VGH is transmitted to the second node PD through the second transistor M2, and the signal of the second node PD is at an active level, thereby controlling the pull-down module 104 to be turned on, and achieving the pull-down of the signal of the first node PU and the gate drive signal Gout.

In another embodiment, referring to FIG. 13, the first pull-down control unit 1021 includes a first transistor M1, the gate of the first transistor M1 receives the first clock signal CLK1, the first electrode of the first transistor M1 and the first electrode of the second transistor M2 of the second pull-down control unit 1022 both receive the second level signal VGH, the second electrode of the first transistor M1 and the gate of the second transistor M2 are electrically connected to the third node A, and the second electrode of the second transistor M2 is electrically connected to the second node PD. When the first clock signal CLK1 is at an active level, the first transistor M1 is turned on, and the active level of the second level signal VGH is transmitted to the third node A through the first transistor M1; at this time, the signal of the third node A is at an active level, the second transistor M2 is turned on, and the active level of the second level signal VGH is transmitted to the second node PD through the second transistor M2, and the signal of the second node PD is at an active level, thereby controlling the pull-down module 104 to be turned on, and achieving the pull-down of the signal of the first node PU and the gate drive signal Gout.

In another optional embodiment, referring to FIG. 12 and FIG. 14, the second pull-down control unit 1022 includes a second transistor M2, the gate of the second transistor M2 is electrically connected to the third node A, the first electrode of the second transistor M2 receives the first clock signal CLK1, and the second electrode of the second transistor M2 is electrically connected to the second node PD.

Specifically, when the signal at the third node A is at an active level, the second transistor M2 is turned on, and the active level of the first clock signal CLK1 can be transmitted to the second node PD; when the signal at the third node A is at an inactive level, the second transistor M2 is turned off, and the first clock signal CLK1 is stopped from being transmitted to the second node PD; when the signal at the first node PU is at an inactive level, the signal at the third node A can be determined by the first clock signal CLK1. In this way, it is also possible to avoid the second transistor M2 receiving a fixed signal for a long time, causing a hysteresis phenomenon, resulting in a threshold voltage shift of the second transistor M2, and affecting the accuracy of the signal at the second node PD; the signal of the third node A can also be controlled under the coordinated action of the input module 101, the noise reduction module 105, and the pull-down control module 102, etc., so that the pull-down control module 102 can be unaffected by the signal jump of the first clock signal CLK1, and continuously control the signal of the second node PD to remain stable. The first switch unit 1021 can be a structure as shown in FIG. 12 or FIG. 14, or the first switch unit 1021 can also be other structures, which is not specifically limited in the embodiment of the present application.

In an embodiment, referring to FIG. 12, the first pull-down control unit 1021 includes a first transistor M1, the gate and the first electrode of the first transistor M1 both receive the first clock signal CLK1, the second electrode of the first transistor M1 and the gate of the second transistor M2 of the second pull-down control unit 1022 are electrically connected to the third node A, the first electrode of the second transistor M2 also receives the first clock signal CLK1, and the second electrode of the second transistor M2 is electrically connected to the second node PD. When the first clock signal CLK1 is at an active level, the first transistor M1 is turned on, and the active level of the first clock signal CLK1 is transmitted to the third node A through the first transistor M1; at this time, the signal of the third node A is at an active level, the second transistor M2 is turned on, and the active level of the first clock signal CLK1 is transmitted to the second node PD through the second transistor M2, and the signal of the second node PD is at an active level, thereby controlling the pull-down module 104 to be turned on, and achieving the pull-down of the signal of the first node PU and the gate drive signal Gout. At this time, the pull-down control module 102 does not need to receive the second level signal VGH, which is beneficial to reducing signal routing. When the shift register 01 is applied to a display panel, it is beneficial to the narrow border design of the display panel.

In another embodiment, referring to FIG. 14, the first pull-down control unit 1021 includes a first transistor M1, the gate of the first transistor M1 and the first electrode of the second transistor M2 of the second pull-down control unit 1022 both receive the first clock signal CLK1, the first electrode of the first transistor M1 receives the second level signal VGH, the second electrode of the first transistor M1 and the gate of the second transistor M2 are electrically connected to the third node A, and the second electrode of the second transistor M2 is electrically connected to the second node PD. When the first clock signal CLK1 is at an active level, the first transistor M1 is turned on, and the active level of the second level signal VGH is transmitted to the third node A through the first transistor M1; at this time, the signal of the third node A is at an active level, the second transistor M2 is turned on, and the active level of the first clock signal CLK1 is transmitted to the second node PD through the second transistor M2, and the signal of the second node PD is at an active level, thereby controlling the pull-down module 104 to be turned on, and achieving the pull-down of the signal of the first node PU and the gate drive signal Gout.

Figure 15:
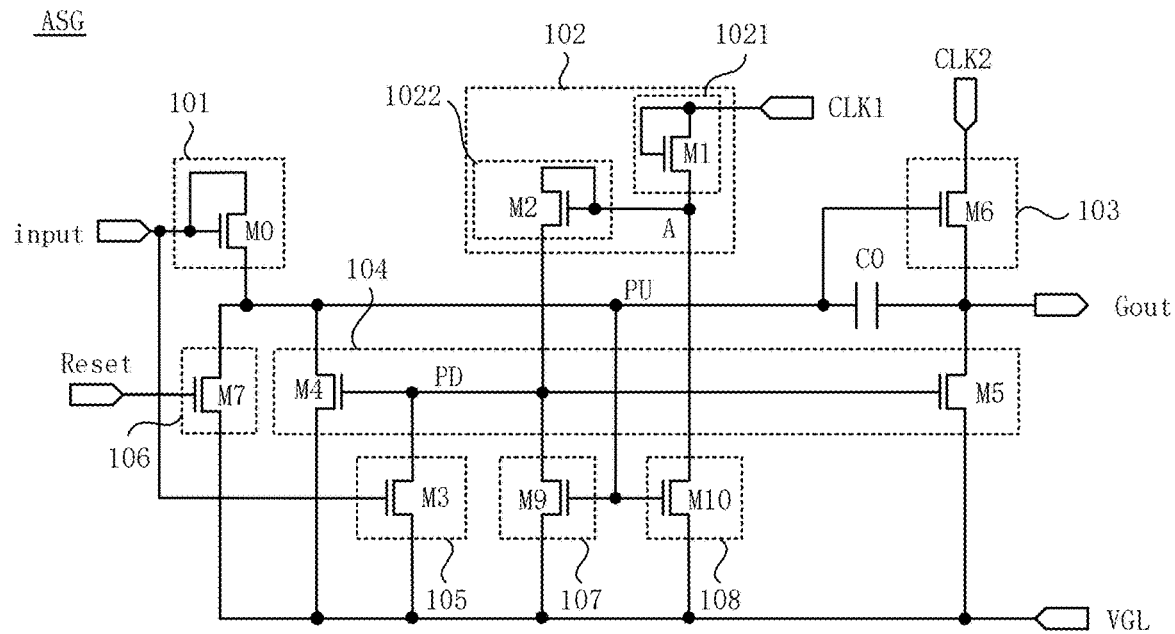
FIG. 15 is a schematic structural diagram of another shift register unit provided by an embodiment of the present application.
Figure 16:
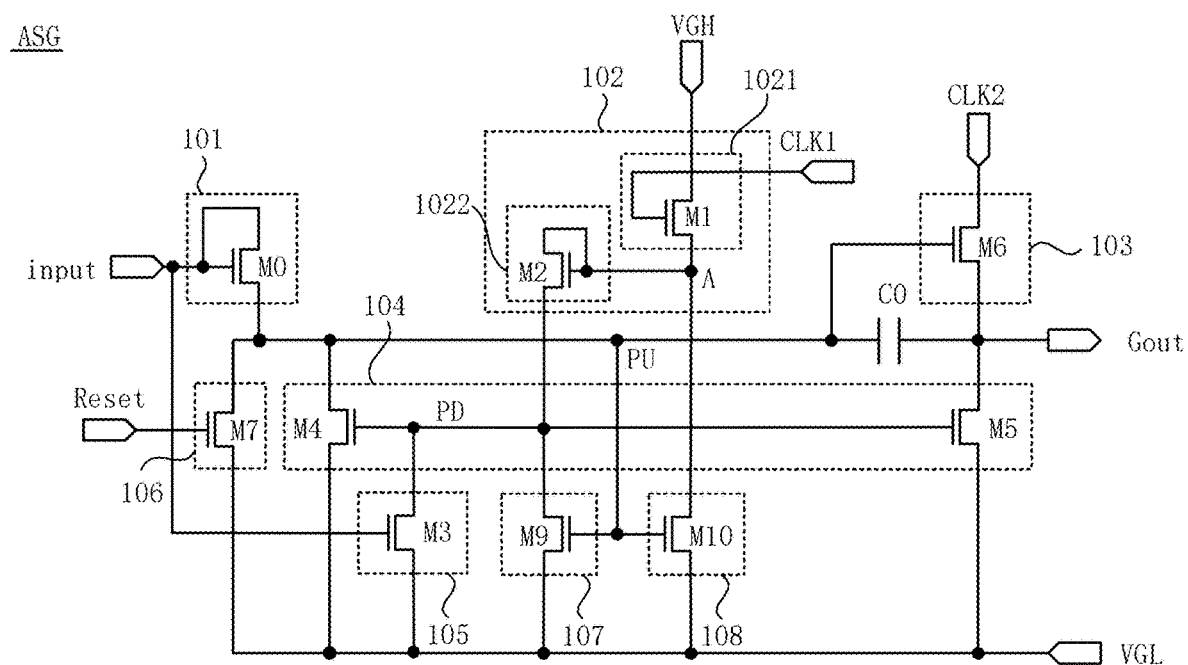
FIG. 16 is a schematic structural diagram of another shift register unit provided by an embodiment of the present application.
Figure 17:
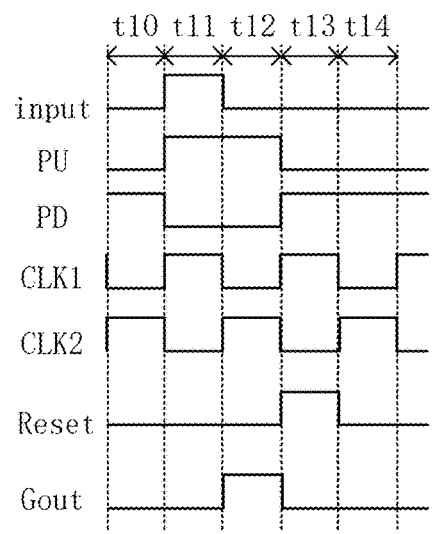
FIG. 17 is a time sequence diagram of another shift register unit provided by an embodiment of the present application.

As other feasible embodiments, FIG. 15 is a schematic structural diagram of another shift register unit provided by an embodiment of the present application, and FIG. 16 is a schematic structural diagram of another shift register unit provided by an embodiment of the present application. Referring to FIG. 15 and FIG. 16, the second pull-down control unit 1022 includes a second transistor M2, the gate and the first electrode of which both receive the signal of the third node A, and the second electrode of which is electrically connected to the second node PD.

Specifically, when the signal of the third node A is at an active level, the second transistor M2 is turned on, and the active level of the third node A can be transmitted to the second node PD; when the signal of the third node A is at an inactive level, the second transistor M2 is turned off, and the signal of the third node A is stopped from being transmitted to the second node PD; when the signal of the first node PU is at an inactive level, the signal of the third node A can be determined by the first clock signal CLK1. At this time, the first switch unit 1021 can be a structure as shown in FIG. 15 or FIG. 16, or the first switch unit 1021 can also be other structures, which are not specifically limited in the embodiment of the present application.

Optionally, referring to FIG. 11 to FIG. 16, the input module 101 includes an input transistor M0, the gate of the input transistor M0 and the first electrode of the input transistor M0 both receive the input signal input, and the second electrode of the input transistor M0 is electrically connected to the first node PU.

Exemplarily, taking the case where the input transistor M0 is an N-type transistor, the active level is a high level, the inactive level is a low level, and the first level signal VGL is at a low level as an example, when the input signal input is at a high level, the input transistor M0 can be turned on under the control of the input signal input, so that the high level of the input signal input can be transmitted to the first node PU, and the signal of the first node PU is at a high level. In other embodiments, the first electrode of the input transistor M0 can also receive a fixed active level (not shown in the figure).

It should be noted that the active level of the input signal input may be a high level or a low level. When the input transistor M0 is an N-type transistor, the active level of the input signal input is a high level and the inactive level is a low level; when the input transistor M0 is a P-type transistor, the active level of the input signal input is a low level and the inactive level is a high level.

Optionally, referring to FIG. 11 to FIG. 16, the output module 103 includes an output transistor M6, the gate of the output transistor M6 is electrically connected to the first node PU, the first electrode of the output transistor M6 receives the second clock signal CLK2, and the second electrode of the output transistor M6 outputs the gate drive signal Gout.

Exemplarily, taking the case where the output transistor M6 is an N-type transistor, the active level is a high level, the inactive level is a low level, and the first level signal VGL is at a low level as an example, when the signal of the first node PU is at a high level, the output transistor M6 can be turned on under the control of the signal of the first node PU, and the second clock signal CLK2 can be output via the output module 103, so that the gate drive signal Gout can be consistent with the second clock signal CLK2. When the signal of the first node PU is at a high level and the second clock signal CLK2 is also at a high level, the gate drive signal Gout output by the shift register unit ASG is at a high level.

It should be noted that the active level of the signal of the first node PU may be a high level or a low level. When the output transistor M6 is an N-type transistor, the active level of the signal of the first node PU is the high level and the inactive level is the low level; when the output transistor M6 is a P-type transistor, the active level of the signal of the first node PU is the low level and the inactive level is the high level.

Optionally, referring to FIG. 11 to FIG. 16, the noise reduction module 105 includes a noise reduction transistor M3, the gate of the noise reduction transistor M3 receives the input signal input, the first electrode of the noise reduction transistor M3 receives the first level signal VGL, and the second electrode of the noise reduction transistor M3 is electrically connected to the second node PD.

Exemplarily, taking the case where the noise reduction transistor M3 is an N-type transistor, the active level is a high level, the inactive level is a low level, and the first level signal VGL is at a low level as an example, when the input signal input is at a high level, the noise reduction transistor M3 can be turned on under the control of the input signal input, so that the first level signal VGL can be transmitted to the second node PD, and the signal of the second node PD is at a low level. In this way, when the input signal input is at a high level, no matter how the potential of the first clock signal CLK1 jumps, whether the pull-down control module 102 is turned on, the signal of the second node PD can be kept at a low level, so that the pull-down module 104 is turned off, thereby ensuring that the active level written by the input module 101 to the first node PU is not affected, which is conducive to improving the competitiveness of the first node PU.

It should be noted that the active level of the input signal input may be a high level or a low level. When the noise reduction transistor M3 is an N-type transistor, the active level of the input signal input is a high level and the inactive level is a low level; when the noise reduction transistor M3 is a P-type transistor, the active level of the input signal input is a low level and the inactive level is a high level.

Optionally, referring to FIG. 11 to FIG. 16, the pull-down module 104 includes a first pull-down transistor M4 and a second pull-down transistor M5, the gate of the first pull-down transistor M4 and the gate of the second pull-down transistor M5 are both electrically connected to the second node PD, the first electrode of the first pull-down transistor M4 and the first electrode of the second pull-down transistor M5 both receive the first level signal VGL, the second electrode of the first pull-down transistor M4 is electrically connected to the first node PU, and the second electrode of the second pull-down transistor M5 is electrically connected to the output end of the output module 103.

Exemplarily, taking the case where the first pull-down transistor M4 and the second pull-down transistor M5 are both N-type transistors, the active level is a high level, the inactive level is a low level, and the first level signal VGL is at a low level as an example, when the signal at the second node PD is at a high level, the first pull-down transistor M4 and the second pull-down transistor M5 are turned on, and the signal at the first node PU and the gate drive signal Gout are consistent with the first level signal VGL, both of which are at a low level, so as to achieve the pull-down of the signal at the first node PU and the gate drive signal Gout.

It should be noted that the active level of the signal at the second node PD may be a high level or a low level. When the first pull-down transistor M4 and the second pull-down transistor M5 are N-type transistors, the active level of the signal at the second node PD is a high level and the inactive level is a low level; when the first pull-down transistor M4 and the second pull-down transistor M5 are P-type transistors, the active level of the signal at the second node PD is a low level and the inactive level is a high level.

Optionally, referring to FIG. 11 to FIG. 16, the pull-up module 107 includes a pull-up transistor M9, the gate of the pull-up transistor M9 is electrically connected to the first node PU, the first electrode of the pull-up transistor M9 receives the first level signal VGL, and the second electrode of the pull-up transistor M9 is electrically connected to the second node PD; the pull-up control module 108 includes a pull-up control transistor M10, the gate of the pull-up control transistor M10 is electrically connected to the first node PU, the first electrode of the pull-up control transistor M10 receives the first level signal VGL, and the second electrode of the pull-up control transistor M10 is electrically connected to the third node A.

Exemplarily, taking the case where the pull-up transistor M9 and the pull-up control transistor M10 are both N-type transistors, the active level is a high level, the inactive level is a low level, and the first level signal VGL is at a low level as an example, when the signal at the first node PU is at a high level, the pull-up transistor M9 and the pull-up control transistor M10 are turned on, the first level signal VGL is transmitted to the second node PD through the pull-up transistor M9, and the first level signal VGL is transmitted to the third node A through the pull-up control transistor M10. The signal at the second node PD and the third node A are both at a low level, so that the pull-down module 104 is turned off and stops the pull-down of the signal at the first node PU and the gate drive signal Gout; when the signal at the first node PU is at a high level, the shift register unit ASG can pull up the gate drive signal Gout under the coordinated control of the input module 101, the output module 103, etc., and output a high level gate drive signal Gout to achieve the pull-up control of the gate drive signal Gout.

It should be noted that the active level of the signal of the first node PU may be a high level or a low level. When the pull-up transistor M9 and the pull-up control transistor M10 are both N-type transistors, the active level of the signal of the first node PU is the high level, and the inactive level is the low level; when the pull-up transistor M9 and the pull-up control transistor M10 are both P-type transistors, the active level of the signal of the first node PU is the low level, and the inactive level is the high level.

Optionally, still referring to FIGS. 11-16, the shift register unit ASG may further include a bootstrap capacitor C0, which is configured to drive the signal of the first node PU to change when the gate drive signal Gout changes.

Exemplarily, the bootstrap capacitor C0 electrically connects the first node PU and the output end of the output module 103, and the case where the active level is a high level, the inactive level is a low level, and the first level signal VGL is at a low level is taken as an example. When the first node PU is at an active level and the output module 103 is turned on, and the second clock signal CLK2 changes from an inactive level to an active level, the output end of the output module 103 also changes from an inactive level to an active level, so that the signal at one end of the bootstrap capacitor C0 is raised. Affected by the coupling effect of the bootstrap capacitor C0, the signal at the other end of the bootstrap capacitor C0 may also be raised, that is, the signal of the first node PU may also be raised, so that the voltage of the first node PU is higher than the voltages of the input and output ends of the output module 103, which is beneficial to the full turning-on of the output module 103. In this way, the turning-on degree of the output module 103 can be increased, and the output capacity of the output module 103 can be improved.

Optionally, referring to FIG. 10, the shift register unit ASG further includes a reset module 106; the reset module 106 is configured to receive at least a reset signal Reset and a first level signal VGL, and control a transmission path of the first level signal VGL to the first node PU according to the reset signal Reset.

Exemplarily, as shown in FIG. 10, the control end of the reset module 106 receives the reset signal Reset, the input end of the reset module 106 receives the first level signal VGL, and the output end of the reset module 106 is electrically connected to the first node PU. When the reset signal Reset is at an active level, the reset module 106 can transmit the first level signal VGL to the first node PU to control the signal of the first node PU to be an inactive level, so that the output module 103 can no longer output the active level of the gate drive signal Gout. The reset module 106 is arranged, after the shift register unit ASG outputs the active level of the gate drive signal Gout, the signal of the first node PU may be reset to an inactive level, which is conducive to maintaining the stability of the signal of the first node PU, simultaneously, and can also prevent the shift register unit ASG from repeatedly outputting the active level of the gate drive signal Gout, so as not to affect the display quality.

In an optional embodiment, still referring to FIGS. 11 to 16, the reset module 106 may include a first reset transistor M7, the gate of the first reset transistor M7 receives the reset signal Reset, the first electrode of the first reset transistor M7 receives the first level signal VGL, and the second electrode of the first reset transistor M7 is electrically connected to the first node PU. When the reset signal Reset is at an active level, the first reset transistor M7 is turned on, and the signal of the first node PU is at the inactive level of the first level signal VGL. At this time, the output module 103 is turned off, and the second clock signal CLK2 can no longer be transmitted to the output end of the output module 103.

In an optional embodiment, referring to FIG. 11 to FIG. 17, clock cycles of the first clock signal CLK1 and the second clock signal CLK2 are the same; during at least part of a time period within a same clock cycle, the polarities of the first clock signal CLK1 and the second clock signal CLK2 are opposite.

Exemplarily, taking the case where the transistors in the shift register units ASGs are all N-type transistors, the active level is a high level, the inactive level is a low level, and the first level signal VGL is at a low level as an example. Referring to FIG. 11 to FIG. 17, during stage t10, the input signal input is at a low level, the input transistor M0 and the noise reduction transistor M3 are both turned off; the signal at the first node PU is at a low level, the signal at the second node PD is at a high level, the output transistor M6, the pull-up transistor M9 and the pull-up control transistor M10 are all turned off, and the first pull-down transistor M4 and the second pull-down transistor M5 are both turned on; during this stage, the first clock signal CLK1 is at a low level, so that the first transistor M1 and the second transistor M2 are both turned off, in addition, although the second clock signal CLK2 is at an active level, the signal at the first node PU controls the output transistor M6 to be turned off, so that the second clock signal CLK2 cannot be output as the gate drive signal Gout; at this time, the second pull-down transistor M5 can pull the gate drive signal Gout down to be at a low level.

During stage t11, the input signal input is at a high level, the input transistor M0 and the noise reduction transistor M3 are both turned on, the input transistor M0 can transmit the input signal input to the first node PU, so that the signal of the first node PU is at a high level, the noise reduction transistor M3 can transmit the first level signal VGL to the second node PD, so that the signal of the second node PD is at a low level, thereby controlling the output transistor M6, the pull-up transistor M9 and the pull-up control transistor M10 to be turned on, and the first pull-down transistor M4 and the second pull-down transistor M5 to be turned off, although during this stage, the first clock signal CLK1 is at an active level, which can control the first transistor M1 to be turned on, and transmit the high level of the first clock signal CLK1 or the second level signal VGH to the third node A, however, since the pull-up control transistor M10 is in the on state, the signal at the third node A is not sufficient to control the second transistor M2 to be in the on state, and the second transistor M2 cannot pull the second node PD to be at a high level, thereby turning off the first pull-down transistor M4 and the second pull-down transistor M5; at the same time, due to the turning on of the noise reduction transistor M3 and the pull-up transistor M9, the signal at the second node PD can be controlled to stably remain at the low level of the first level signal VGL, and the signal at the first node PU can be stabilized at a high level, so that the output transistor M6 can be stably turned on, and the output transistor M6 can output the second clock signal CLK2 as the gate drive signal Gout; at the same time, since during this stage, the second clock signal CLK2 is at a low level, the gate drive signal Gout output by the shift register unit ASG is at a low level.

During stage t12, the input signal input is at a low level, and the input transistor M0 and the noise reduction transistor M3 are both turned off, during this stage, the first clock signal CLK1 is at a low level, and the second clock signal CLK2 is at a high level. Under the premise that no new signal is written to the gate of each transistor in the shift register unit ASG, the signal of the second node PD can be maintained at a low level, and the signal of the first node PU can also be maintained at a high level. The output transistor M6 continues to be turned on, and the output transistor M6 continues to output the high level of the second clock signal CLK2 as the gate drive signal Gout, that is, the gate drive signal Gout output by the shift register unit ASG is at a high level.

During stage t13, the input signal input continues to be maintained at a low level, the input transistor M0 and the noise reduction transistor M3 remain turned off, the signal of the first node PU is no longer controlled by the input transistor M0, and the signal of the second node PD is no longer controlled by the noise reduction transistor M3; During this stage, the first clock signal CLK1 and the reset signal Reset are both at a high level, the first reset transistor M7 is turned on under the control of the reset signal Reset, and the first transistor M1 is turned on under the control of the first clock signal CLK1, so that the first reset transistor M7 can reset the signal of the first node PU to be at a low level, the pull-up control transistor M10 and the pull-up transistor M9 are both turned off, and the signal of the third node A is controlled by the first clock signal CLK1 or the second level signal VGH transmitted by the first transistor M1, resulting in the signal of the third node A at a high level to control the turning on of the second transistor M2. At this time, the first clock signal CLK1, the signal of the third node A or the second level signal VGH can be transmitted to the second node PD through the second transistor M2, so that the signal of the second node PD changes to a high level, and the first pull-down transistor M4 and the second pull-down transistor M5 are turned on under the control of the signal of the second node PD to pull down the signal of the first node PU and the gate drive signal Gout. The signal of the first node PU and the gate drive signal Gout are both at a low level, that is, the shift register unit ASG outputs a low level of the gate drive signal Gout.

During stage t14, the input signal input continues to be at a low level, and the input transistor M0 and the noise reduction transistor M3 remain turned off, during this stage, the first clock signal CLK1 is at a low level, and the second clock signal CLK2 is at a high level. Under the premise that no new signal is written to the gates of the respective transistors in the shift register unit ASG, the signal at the second node PD can be maintained at a high level, and the signal at the first node PU can also be maintained at a low level. The output transistor M6 is turned off, and the second clock signal CLK2 cannot be output as the gate drive signal Gout. The first pull-down transistor M4 and the second pull-down transistor M5 are turned on, and the gate drive signal Gout continues to be maintained at a low level.

After the stage t14, the input signal input may remain at a low level. When the first clock signal CLK1 is at a high level and the second clock signal CLK2 is at a low level, the first transistor M1 and the second transistor M2 are turned on, and the high-level signal can be supplemented to the second node PD. The first pull-down transistor M4 and the second pull-down transistor M5 are turned on under the control of the signal of the second node PD, so that the signal of the first node PU is at a low level, the output transistor M6 is turned off, and the gate drive signal Gout remains at a low level; when the first clock signal CLK1 is at a low level and the second clock signal CLK2 is at a high level, if no new signal is written to the gate of each transistor in the shift register unit ASG, then the signal of the second node PD can continue to be maintained at a high level, and the signal of the first node PU can continue to be maintained at a low level, the output transistor M6 is turned off, and the second clock signal CLK2 cannot be output as the gate drive signal Gout, and the gate drive signal Gout continues to be maintained at a low level; in this way, no matter how the first clock signal CLK1 and the second clock signal CLK2 jump between the high level and the low level, the signal of the first node PU can continue to be maintained at a low level, the signal of the second node PD can continue to be maintained at a high level, and the gate drive signal GOUT output by the shift register unit ASG may continue to remain at a low level until the input signal input jumps to a high level again.

With such a configuration, the polarities of the first clock signal CLK1 and the second clock signal CLK2 are opposite during at least part of the time period within the same clock cycle, so that the first clock signal CLK1 may be at an inactive level when the output module 103 outputs the active level of the second clock signal CLK2 (stage t12). At this time, the pull-down control module 102 is turned off, and the signal of the second node PD is at an inactive level, which can improve the reliability of the shift register unit ASG and prevent the first clock signal CLK1 from controlling the pull-down control module 102 to be turned on when the output module 103 outputs the active level of the second clock signal CLK2, which would otherwise cause the signal of the second node PD to be at an active level, so that the shift register unit ASG cannot stably output the active level of the gate drive signal GOUT.

In other optional embodiments, the first clock signal may be also used as the second clock signal. In this way, the circuit structure can be simplified, the signal routing can be reduced, which is conducive to reducing costs, and the space occupied by the shift register can be reduced. When applied to a display panel, it is conducive to the low cost and thinness of the display panel.

Figure 18:
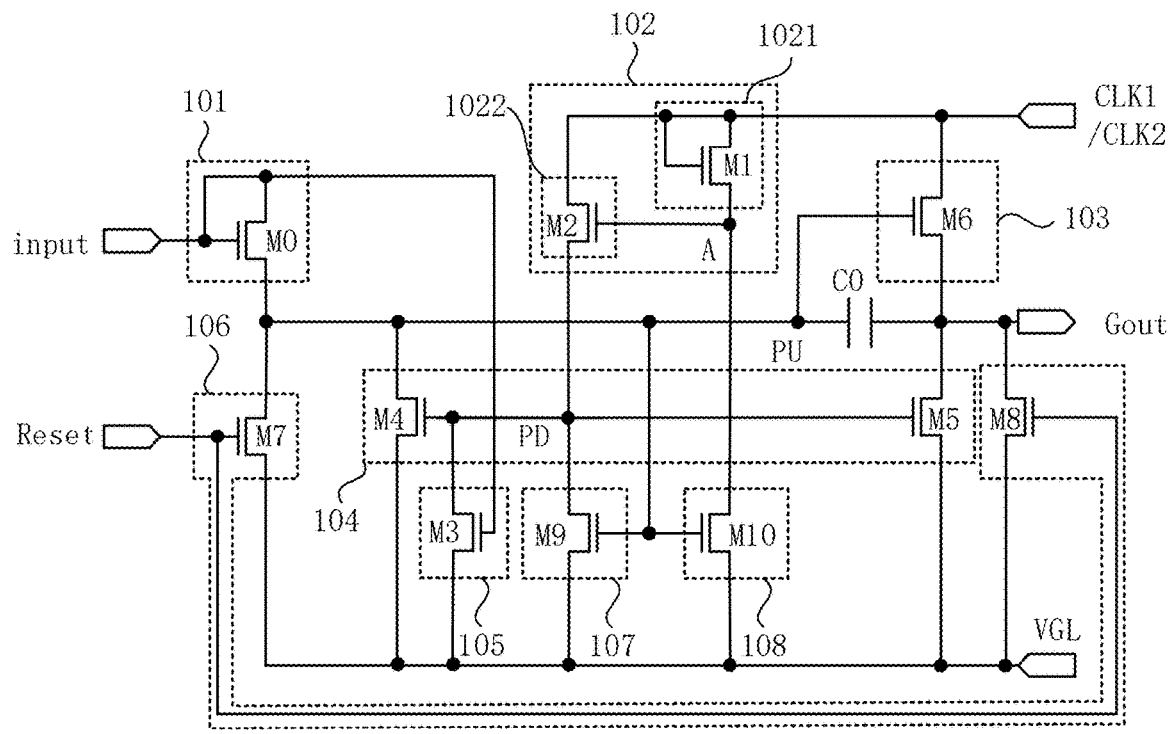
FIG. 18 is a schematic structural diagram of another shift register unit provided by an embodiment of the present application.
Figure 19:
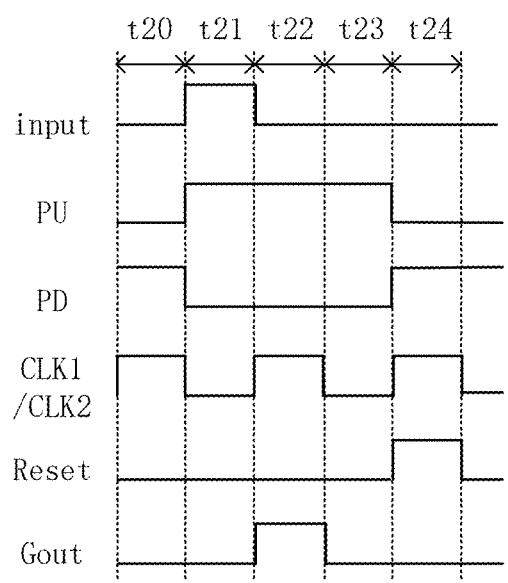
FIG. 19 is a time sequence diagram of another shift register unit provided by an embodiment of the present application.

Exemplarily, taking the case where the transistors in the shift register units ASGs are all N-type transistors, the active level is a high level, the inactive level is a low level, the first level signal VGL is at a low level, and the second level signal VGH is at a high level as an example, FIG. 18 is a schematic structural diagram of another shift register unit provided by an embodiment of the present application, and FIG. 19 is a time sequence diagram of another shift register unit provided by an embodiment of the present application. Referring to FIG. 18 and FIG. 19, during stage t20, the input signal input is at an inactive level, the input transistor M0 and the noise reduction transistor M3 are turned off, the first clock signal CLK1 is at a high level, so that the first transistor M1 and the second transistor M2 are turned on, the signal of the first node PU is at a low level, and the signal of the second node PD is at a high level, thereby controlling the output transistor M6, the pull-up transistor M9 and the pull-up control transistor M10 to be turned off, and controlling the first pull-down transistor M4 and the second pull-down transistor M5 to be turned on; at the same time, although during this stage, the first clock signal CLK1 and the second clock signal CLK2 are both at a high level, the output transistor M6 is in the off state, so that the second clock signal CLK2 cannot be output as the gate drive signal Gout, and the gate drive signal Gout is pulled down to be at a low level by the second pull-down transistor M5.

During stage t21, the input signal input is at a high level, the input transistor M0 and the noise reduction transistor M3 are turned on, the input transistor M0 can transmit the input signal input to the first node PU, so that the signal of the first node PU is at a high level, the noise reduction transistor M3 can transmit the first level signal VGL to the second node PD, so that the signal of the second node PD is at a low level, thereby controlling the output transistor M6, the pull-up transistor M9 and the pull-up control transistor M10 to be turned on, and the first pull-down transistor M4 and the second pull-down transistor M5 to be turned off; during this stage, the first clock signal CLK1 and the second clock signal CLK2 are both at a low level, so that the gate drive signal Gout is at a low level when the output transistor M6 outputs the second clock signal CLK2 as the gate drive signal Gout.

During stage t22, the input signal input is at a low level, the input transistor M0 and the noise reduction transistor M3 are both turned off, the signal at the first node PU is no longer controlled by the input transistor M0, and the signal at the second node PD is no longer controlled by the noise reduction transistor M3; at this time, because the first clock signal CLK1 and the second clock signal CLK2 are both at a high level, the gate drive signal Gout may also jump to be at a high level, that is, the gate drive signal Gout output by the shift register unit ASG is at a high level.

During stage t23, the input signal input is at a low level, the input transistor M0 and the noise reduction transistor M3 are both turned off, at the same time, during this stage, the first clock signal CLK1 and the second clock signal CLK2 are both at a low level. Because there is no new signal written to the gate of each transistor in the shift register unit ASG, the signal at the second node PD can be maintained at a low level, and the signal at the first node PU can also be maintained at a high level, and the output transistor M6 continues to be turned on, and the output transistor M6 can output the low level of the second clock signal CLK2 as the gate drive signal Gout.

During stage t24, the input signal input continues to be at a low level, and the input transistor M0 and the noise reduction transistor M3 are both turned off; the reset signal Reset is at a high level, so that the first reset transistor M7 can reset the signal of the first node PU to be at a low level, and the pull-up transistor M9 and the pull-up control transistor M10 are both turned off; at the same time, because the first clock signal CLK1 and the second clock signal CLK2 are both at a high level, the first transistor M1 and the second transistor M2 are both turned on, so that the signal of the second node PD is at a high level, and the signal of the second node PD controls the first pull-down transistor M4 and the second pull-down transistor M5 to be turned on, so as to pull down the signal of the first node PU and the gate drive signal Gout. The signal of the first node PU and the gate drive signal Gout are both at a low level, ensuring that the shift register unit ASG can output the low level of the gate drive signal Gout after outputting the high level of the gate drive signal Gout, and reset the potential of the gate drive signal Gout, so as to prevent the gate drive signal Gout from being at a high level for a long time to affect the display quality.

After stage t24, the input signal input and the reset signal Reset remain at a low level. When the first clock signal CLK1 and the second clock signal CLK2 are both at a high level, the first transistor M1 and the second transistor M2 are turned on, so that the signal of the second node PD is at a high level. The first pull-down transistor M4 and the second pull-down transistor M5 are turned on under the control of the signal of the second node PD, so that the signal of the first node PU is at a low level and the gate drive signal Gout remains at a low level. When the first clock signal CLK1 and the second clock signal CLK2 are both at a low level, no new active level is written to the gate of each transistor in the shift register unit ASG, the signal of the first node PU can be maintained at a low level, the signal of the second node PD can also be maintained at a high level, and the gate drive signal Gout remains at a low level. No matter how the first clock signal CLK1 and the second clock signal CLK2 jump between a high level and a low level, the signal of the first node PU can remain at an inactive level, the signal of the second node PD can remain at an active level, and the gate drive signal GOUT output by the shift register unit ASG remains at a low level until the input signal input jumps to a high level again.

It can be understood that, in the same shift register unit ASG, the effective time of the reset signal Reset may be after the effective time of the gate drive signal Gout. In this way, it can be ensured that after the shift register unit ASG outputs the active level of the gate drive signal Gout, the potential of the gate drive signal Gout is reset by the reset signal Reset, so that the gate drive signal Gout output by the shift register unit ASG is at an inactive level, which is beneficial to the accuracy of the gate drive signal Gout.

On the basis of the above-mentioned embodiments, the reset module may also be used to control the gate drive signal according to the reset signal and the first level signal. In this way, after the shift register unit outputs the active level of the gate drive signal, the gate drive signal can be reset to be at an inactive level, which is beneficial to maintaining the stability of the gate drive signal and improving the display quality.

Exemplarily, still referring to FIG. 18, the control end of the reset module 106 receives the reset signal Reset, the input end of the reset module 106 receives the first level signal VGL, and the output end of the reset module 106 can be electrically connected to the first node PU and the output end of the output module 103, respectively. In an optional embodiment, the reset module 106 includes a first reset transistor M7 and a second reset transistor M8, the gate of the first reset transistor M7 and the gate of the second reset transistor M8 both receive a reset signal Reset, the first electrode of the first reset transistor M7 and the first electrode of the second reset transistor M8 both receive a first level signal VGL, the second electrode of the first reset transistor M7 is electrically connected to the first node PU, and the second electrode of the second reset transistor M8 is electrically connected to the output end of the output module 103.

Taking the case where the transistors in the shift register units ASGs are all N-type transistors, the active level is a high level, the inactive level is a low level, and the first level signal VGL is at a low level as an example. Still referring to FIG. 18 and FIG. 19, when the reset signal Reset is at a high level, the first reset transistor M7 and the second reset transistor M8 are turned on, and the signal of the first node PU and the gate drive signal Gout are both at a low level of the first level signal VGL, which can ensure that the shift register unit ASG resets the potential of the gate drive signal Gout after outputting the high level of the gate drive signal Gout, and outputs the low level of the gate drive signal Gout, which is conducive to maintaining the stability of the gate drive signal Gout.

Figure 20:
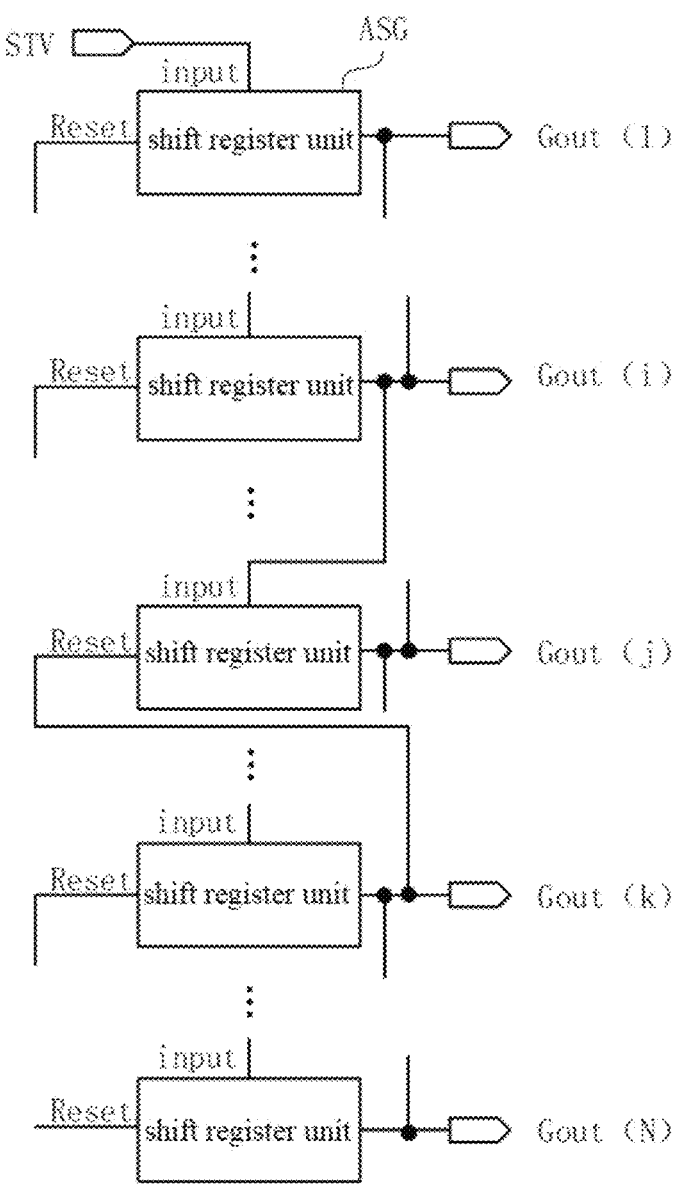
FIG. 20 is a schematic structural diagram of another shift register provided by an embodiment of the present application.
Figure 21:
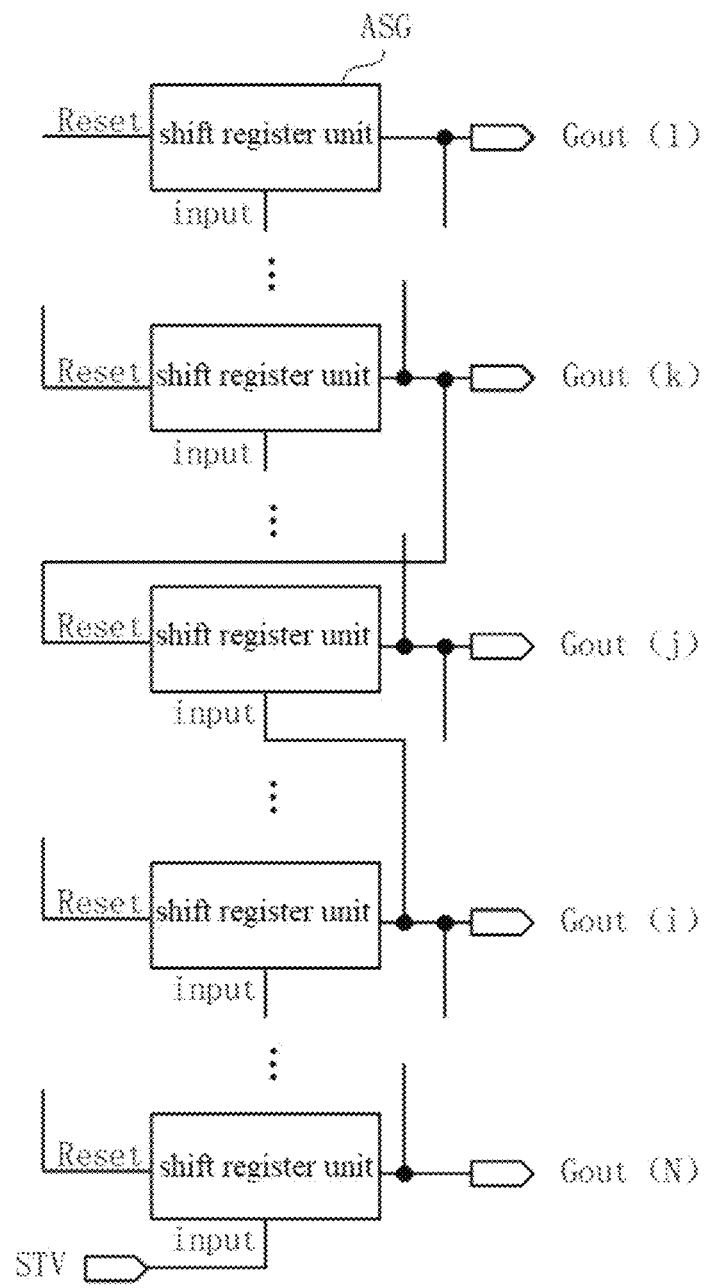
FIG. 21 is a schematic structural diagram of another shift register provided by an embodiment of the present application.

Optionally, FIG. 20 is a schematic structural diagram of another shift register provided by an embodiment of the present application, and FIG. 21 is a schematic structural diagram of another shift register provided by an embodiment of the present application. Referring to FIG. 20 and FIG. 21, the gate drive signal Gout(k) of the shift register unit ASG at the k-th stage is the reset signal Reset of the shift register unit ASG at the j-th stage, where k is a positive integer, k≠j and k is less than or equal to N.

Specifically, after the shift register unit ASG at the j-th stage outputs the active level of the gate drive signal Gout(j), the shift register unit ASG at the j-th stage receives the active level of the reset signal Reset, that is, the effective time of the gate drive signal Gout(k) of the shift register unit ASG at the k-th stage is after the effective time of the gate drive signal Gout(j) of the shift register unit ASG at the j-th stage.

Accordingly, the effective time of the gate drive signal Gout(i) of the shift register unit ASG at the i-th stage is before the effective time of the gate drive signal Gout(j) of the shift register unit ASG at the j-th stage. When i<j, the effective time of the gate drive signal Gout of the shift register unit ASG at a back stage is after the effective time of the gate drive signal Gout of the shift register unit ASG at a front stage, and at this time, k>j, as shown in FIG. 20; when i>j, the effective time of the gate drive signal Gout of the shift register unit ASG at a front stage is after the effective time of the gate drive signal Gout of the shift register unit ASG at a back stage, and at this time, k<j, as shown in FIG. 21. In this way, it is ensured that after the shift register unit ASG at the j-th stage outputs the active level of the gate drive signal Gout(j), the shift register unit ASG at the j-th stage can receive the active level of the reset signal Reset, so that the potential of the gate drive signal Gout(j) can be reset and restored to be at the inactive level after the shift register unit ASG at the j-th stage outputs the active level of the gate drive signal Gout(j).

It can be understood that k may be less than j, or k may be greater than j. The relationship among i, j, and k may be k>j>i, or k<j<i.

In an optional embodiment, |k−j|=|i−j|, when k>j>i, k−j=j−i; when k<j<i, j−k=i−j. In an embodiment, j=i+5, k=j+5. In another embodiment, j=i−5, k=j−5.

In another optional embodiment, |k−j|≠|i−j|. In an embodiment, j=i+5; k=j+4. In another embodiment, j=i−5, k=j−4.

It can be understood that, under the premise that the gate drive signal Gout(k) of the shift register unit ASG at the k-th stage can be used as the reset signal Reset of the shift register unit ASG at the j-th stage, in the embodiments of the present application, the relationship among i, j and k may also be other situations, which will not be listed one by one in the embodiments of the present application. In other words, in the present application, the cascade relationship of the shift register units ASGs can be flexibly set according to actual needs, so that the gate drive signal Gout (i) output by the shift register unit ASG at the i-th stage is also used as the input signal input of the shift register unit ASG at the j-th stage, and the gate drive signal Gout (k) output by the shift register unit ASG at the k-th stage is also used as the reset signal Reset of the shift register unit ASG at the j-th stage, thereby reducing the quantity of signals provided to the shift register 01, simplifying the driving method of the shift register 01, and reducing the driving cost of the shift register on the premise of ensuring that the active levels of the gate drive signals Gout output by the shift register units ASGs at respective stages can be shifted in sequence.

Figure 22:
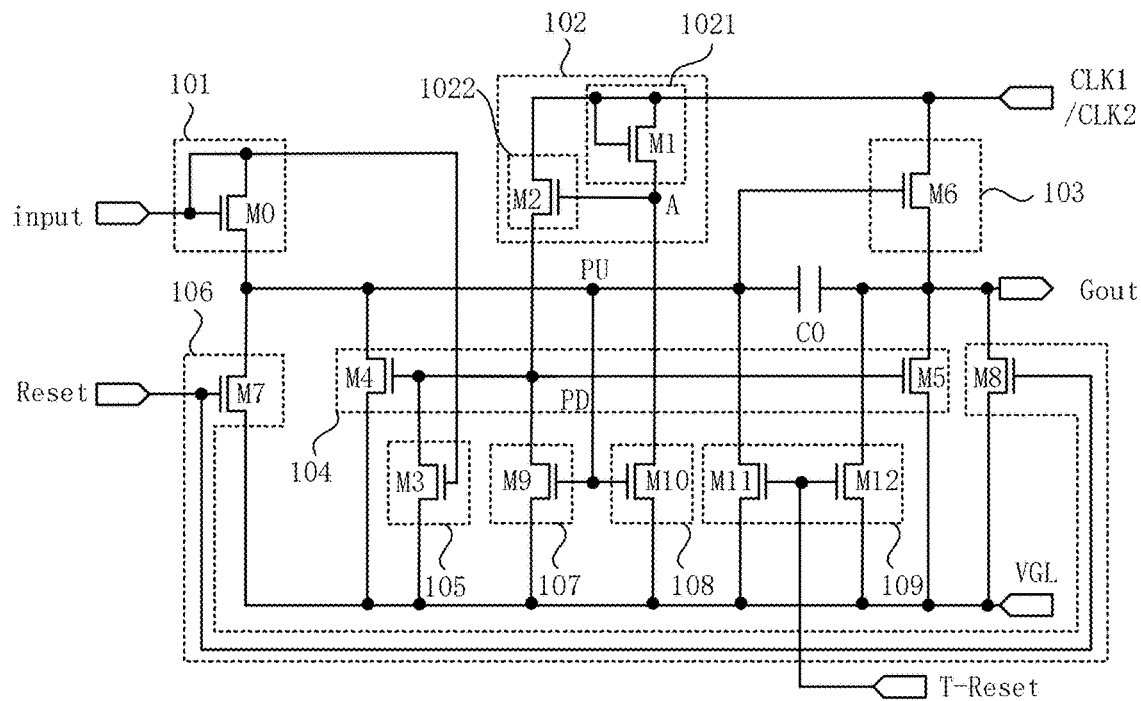
FIG. 22 is a schematic structural diagram of another shift register unit provided by an embodiment of the present application.

Optionally, FIG. 22 is a schematic structural diagram of another shift register unit provided by an embodiment of the present application. Referring to FIG. 22, the shift register unit ASG further includes a restoration module 109, which is configured to receive at least the restoration signal T-Reset and the first level signal VGL, and control the signal of the first node PU and the gate drive signal Gout.

Exemplarily, the control end of the restoration module 109 receives the restoration signal T-Reset, the input end of the restoration signal T-Reset receives the first level signal VGL, and the output end of the first level signal VGL is electrically connected to the first node PU and the output end of the output module 103, respectively. When the restoration signal T-Reset is at an active level, the restoration module 109 is turned on, and the signal of the first node PU and the output gate drive signal Gout are the first level signal VGL, both of which are at an inactive level. In this way, the restoration module 109 can restore the signal of the first node PU and the output gate drive signal Gout to be at an inactive level, so as to clear the residual electrical signal of the first node PU and the output end of the output module 103 before the input signal input jumps to an active level, thereby preventing the residual electrical signal at the first node PU and the output end of the output module 103 from affecting the coordinated action of the shift register units ASGs, which would otherwise cause the shift register units ASGs to be unable to accurately output the active levels of the gate drive signals Gout, and affect the reliability of the shift register units ASGs.

In an optional embodiment, the restoration module 109 includes a first restoration transistor M11 and a second restoration transistor M12, the gate of the first restoration transistor M11 and the gate of the second restoration transistor M12 both receive the restoration signal T-Reset, the first electrode of the first restoration transistor M11 and the first electrode of the second restoration transistor M12 both receive the first level signal VGL, the second electrode of the first restoration transistor M11 is electrically connected to the first node PU, and the second electrode of the second restoration transistor M12 is electrically connected to the output end of the output module 103.

Figure 23:
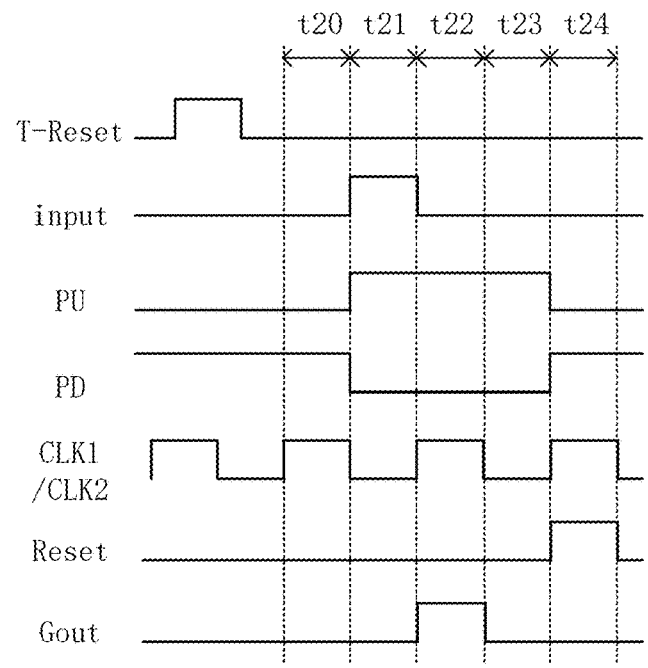
FIG. 23 is a time sequence diagram of a shift register unit provided by an embodiment of the present application.

Exemplarily, taking the case where the active levels are all high levels, the inactive levels are all low levels, and the first level signal VGL is at a low level as an example, FIG. 23 is a driving time sequence diagram of a shift register unit provided by an embodiment of the present application. Referring to FIG. 23 and FIG. 23, when the restoration signal T-Reset is at a high level and the input signal input is at a low level, the input transistor M0 and the noise reduction transistor M3 are both turned off, and the first restoration transistor M11 and the second restoration transistor M12 are turned on, so that the signal of the first node PU and the output gate drive signal Gout are the first level signal VGL, that is, the signal of the first node PU and the output gate drive signal Gout are both at a low level, and the output transistor M6, the pull-up transistor M9 and the pull-up control transistor M10 are all turned off; at the same time, the first clock signal CLK1 and the second clock signal CLK2 are both at a high level, the first transistor M1 and the second transistor M2 are turned on, so that the second node PD is at a high level, the first pull-down transistor M4 and the second pull-down transistor M5 are turned on, and the signal of the first node PU and the output gate drive signal Gout are both at a low level. In this way, the signal of the first node PU and the output gate drive signal Gout can be restored by the first restoration transistor M11 and the second restoration transistor M12 of the restoration module 109, ensuring that the signal of the first node PU is at an inactive level. When the restoration signal T-Reset is at an active level, regardless of whether the first clock signal CLK1 is at an active level or an inactive level, the signal of the first node PU can be made to be at an inactive level, and the output gate drive signal Gout can be made to be at an inactive level. In this way, it is possible to prepare for the subsequent writing of the active level of the input signal input and the active level of the gate drive signal Gout output by the shift register unit ASG.

It should be noted that the active level of the restoration signal T-Reset may be a high level or a low level. When the first restoration transistor M11 and the second restoration transistor M12 are both N-type transistors, the active level of the restoration signal T-Reset is a high level and the inactive level is a low level; when the first restoration transistor M11 and the second restoration transistor M12 are both P-type transistors, the active level of the restoration signal T-Reset is a low level and the inactive level is a high level.

Figure 24:
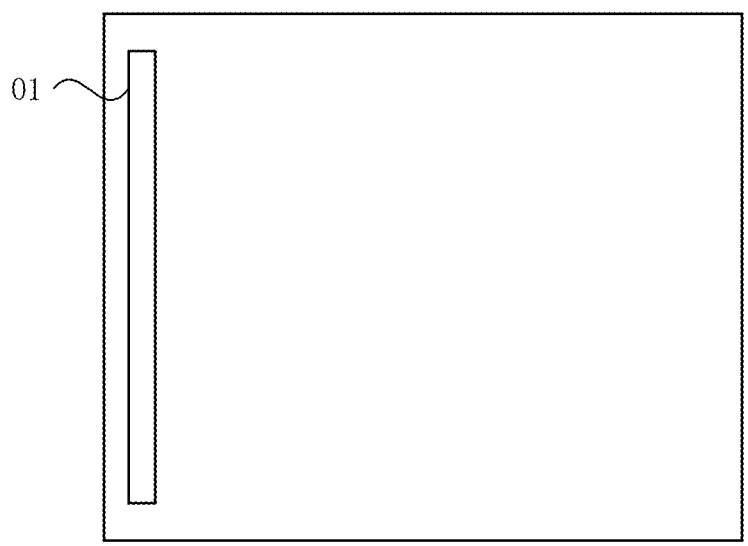
FIG. 24 is a schematic structural diagram of a display panel provided by an embodiment of the present application.

Based on the same inventive concept, an embodiment of the present application further provides a display panel. FIG. 24 is a schematic structural diagram of a display panel provided by an embodiment of the present application. As shown in FIG. 24, the display panel 02 includes a shift register 01 provided by any embodiment of the present application.

It should be noted that when the shift register 01 provided by the embodiments of the present application is applied to the display panel 02, the shift register 01 may be located in the display area (not shown in the figure) of the display panel 02, or in the non-display area (not shown in the figure) of the display panel 02; when the shift register 01 is located in the non-display area, the shift register 01 may be located on any one side, two sides, three sides or four sides of the display area, etc. The embodiments of the present application do not limit the position of the shift register 01 in the display panel 02.

Figure 25:
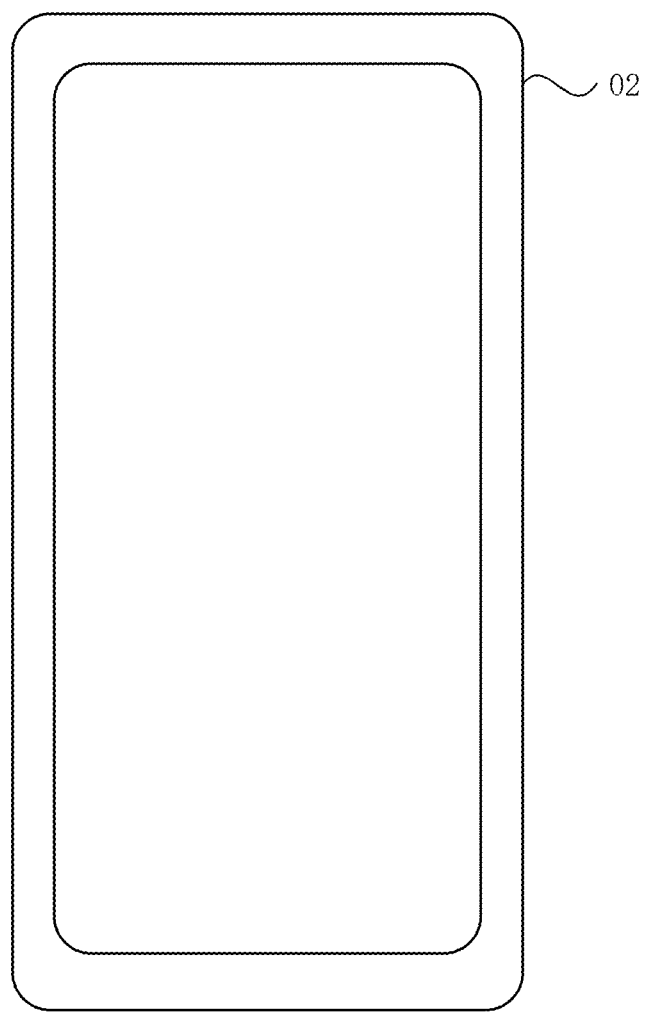
FIG. 25 is a schematic structural diagram of a display device provided by an embodiment of the present application.

Based on the same inventive concept, an embodiment of the present application further provides a display device. FIG. 25 is a schematic structural diagram of a display device provided by an embodiment of the present application. As shown in FIG. 25, the display device 03 includes a display panel 02 provided by any embodiment of the present application. The display device 03 provided in the embodiments of the present application may be a mobile phone as shown in FIG. 25, or any electronic product with a display function, including but not limited to the following categories: televisions, laptops, desktop displays, tablet computers, digital cameras, smart bracelets, smart glasses, vehicle displays, medical equipment, industrial control equipment, touch interactive terminals, etc., which is not specifically limited by the embodiments of the present application.

Note that the above are only preferred embodiments of the present application and the technical principles used. Those skilled in the art will understand that the present application is not limited to the specific embodiments described herein, and that various obvious changes, readjustments and substitutions can be made by those skilled in the art without departing from the scope of protection of the present application. Therefore, although the present application has been described in more detail through the above embodiments, the present application is not limited to the above embodiments, and may include more other equivalent embodiments without departing from the concept of the present application, and the scope of the present application is determined by the scope of the appended claims.

What is claimed is:

1. A shift register, comprising N cascaded shift register units, each of which comprises an input circuit, a noise reduction circuit, a pull-down control circuit, a pull-down circuit, and an output circuit, wherein in the same shift register unit,
the input circuit is configured to receive at least an input signal and control a signal of a first node;
the noise reduction circuit is configured to receive at least the input signal and a first level signal, and control a transmission path of the first level signal to a second node according to the input signal;

the pull-down control circuit is configured to receive at least a first clock signal and control a signal of the second node;

the output circuit is configured to receive at least a second clock signal and a signal of the first node and control a gate drive signal;

the pull-down circuit is configured to receive at least the signal of the second node and the first level signal and control the signal of the first node and the gate drive signal, and wherein a gate drive signal of the shift register unit at an i-th stage is an input signal of the shift register unit at a j-th stage, where i, j and N each are positive integers, i≠j and i and j are both less than or equal to N.

2. The shift register according to claim 1, wherein the pull-down control circuit comprises a first pull-down control unit and a second pull-down control unit; and the first pull-down control unit is configured to receive at least the first clock signal and control a signal of a third node.

3. The shift register according to claim 2, wherein the first pull-down control unit comprises:

a first transistor, a gate and a first electrode of the first transistor both receiving the first clock signal, and a second electrode of the first transistor being electrically connected to the third node.

4. The shift register according to claim 2, wherein the first pull-down control unit comprises a first transistor; and a gate of the first transistor receives the first clock signal, a first electrode of the first transistor receives a second level signal; and a second electrode of the first transistor is electrically connected to the third node.

5. The shift register according to claim 2, wherein the second pull-down control unit comprises a second transistor; and a gate of the second transistor is electrically connected to the third node, a first electrode of the second transistor receives a second level signal, and a second electrode of the second transistor is electrically connected to the second node.

6. The shift register according to claim 2, wherein the second pull-down control unit comprises a second transistor; and a gate of the second transistor is electrically connected to the third node, a first electrode of the second transistor receives the first clock signal, and a second electrode of the second transistor is electrically connected to the second node.

7. The shift register according to claim 1, wherein the first clock signal serves as the second clock signal.

8. The shift register according to claim 1, wherein clock cycles of the first clock signal and the second clock signal are the same; and during at least part of a time period within a same clock cycle, the first clock signal and the second clock signal have opposite polarities.

9. The shift register according to claim 1, wherein the noise reduction circuit comprises a noise reduction transistor; and a gate of the noise reduction transistor receives the input signal, a first electrode of the noise reduction transistor receives the first level signal, and a second electrode of the noise reduction transistor is electrically connected to the second node.

10. The shift register according to claim 1, wherein the shift register units each further comprise a reset circuit; and the reset circuit is configured to receive at least a reset signal and the first level signal, and control a transmission path of the first level signal to the first node according to the reset signal.

11. The shift register according to claim 10, wherein the reset circuit is further configured to control the gate drive signal according to the reset signal and the first level signal.

12. The shift register according to claim 11, wherein a gate drive signal of the shift register unit at a k-th stage is a reset signal of the shift register unit at the j-th stage, where k is a positive integer, k≠j and k is less than or equal to N.

13. The shift register according to claim 12, wherein j=i+5; k=j+4 or k=j+5.

14. The shift register according to claim 11, wherein the reset circuit comprises a first reset transistor and a second reset transistor; and a gate of the first reset transistor and a gate of the second reset transistor both receive the reset signal; a first electrode of the first reset transistor and a first electrode of the second reset transistor both receive the first level signal; a second electrode of the first reset transistor is electrically connected to the first node, and a second electrode of the second reset transistor outputs the gate drive signal.

15. The shift register according to claim 1, wherein the shift register units each further comprise a pull-up control circuit and a pull-up circuit;

the pull-up control circuit is configured to receive at least the signal of the first node and the first level signal to control a signal of a third node;

the pull-down control circuit is further configured to control the signal of the second node according to the signal of the third node; and the pull-up circuit is configured to receive at least the signal of the first node and the first level signal to control the signal of the second node.

16. The shift register according to claim 1, wherein the shift register units each further comprise a restoration circuit; and the restoration circuit is configured to receive at least a restoration signal and the first level signal to control the signal of the first node and the gate drive signal.

17. A display panel, comprising a shift register that comprises N cascaded shift register units, each of which comprises an input circuit, a noise reduction circuit, a pull-down control circuit, a pull-down circuit, and an output circuit, wherein in the same shift register unit, the input circuit is configured to receive at least an input signal and control a signal of a first node;

the noise reduction circuit is configured to receive at least the input signal and a first level signal, and control a transmission path of the first level signal to a second node according to the input signal;

the pull-down control circuit is configured to receive at least a first clock signal and control a signal of the second node;

the output circuit is configured to receive at least a second clock signal and a signal of the first node and control a gate drive signal;

the pull-down circuit is configured to receive at least the signal of the second node and the first level signal and control the signal of the first node and the gate drive signal, and wherein a gate drive signal of the shift register unit at an i-th stage is an input signal of the shift register unit at a j-th stage, where i, j and N each are positive integers, i≠j and i and j are both less than or equal to N.

18. A display device, comprising a display panel that comprises a shift register including N cascaded shift register units, each of which comprises an input circuit, a noise reduction circuit, a pull-down control circuit, a pull-down circuit, and an output circuit, wherein in the same shift register unit, the input circuit is configured to receive at least an input signal and control a signal of a first node;

the noise reduction circuit is configured to receive at least the input signal and a first level signal, and control a transmission path of the first level signal to a second node according to the input signal;

the pull-down control circuit is configured to receive at least a first clock signal and control a signal of the second node;

the output circuit is configured to receive at least a second clock signal and a signal of the first node and control a gate drive signal;

the pull-down circuit is configured to receive at least the signal of the second node and the first level signal and control the signal of the first node and the gate drive signal, and wherein a gate drive signal of the shift register unit at an i-th stage is an input signal of the shift register unit at a j-th stage, where i, j and N each are positive integers, i≠j and i and j are both less than or equal to N.

* * * * *